(12) United States Patent
Rhodes et al.

(10) Patent No.: US 7,075,049 B2
(45) Date of Patent: Jul. 11, 2006

(54) DUAL CONVERSION GAIN IMAGERS

(75) Inventors: Howard E. Rhodes, Boise, ID (US); Sungkwon Hong, Boise, ID (US)

(73) Assignee: Micron Technology, Inc., Boise, ID (US)

(*) Notice: Subject to any disclaimer, the term of this patent is extended or adjusted under 35 U.S.C. 154(b) by 363 days.

(21) Appl. No.: 10/458,262

(22) Filed: Jun. 11, 2003

(65) Prior Publication Data

US 2004/0251394 A1    Dec. 16, 2004

(51) Int. Cl.
*H01L 27/00* (2006.01)
*H01L 31/062* (2006.01)

(52) U.S. Cl. .............................. 250/208.1; 250/214.1; 250/214 AG; 257/291

(58) Field of Classification Search ............. 250/208.1, 250/214.1, 214 AG; 348/300–310; 257/290, 257/291, 294; 438/109, 110
See application file for complete search history.

(56) References Cited

U.S. PATENT DOCUMENTS

| | | | |
|---|---|---|---|
| 4,734,776 A | 3/1988 | Wang et al. | |
| 5,049,752 A | 9/1991 | Kalaf et al. | |
| 5,355,165 A | 10/1994 | Kosonocky et al. | |
| 5,396,288 A | 3/1995 | Tsugita et al. | |
| 5,422,669 A | 6/1995 | Mori | |
| 5,841,126 A | 11/1998 | Fossum et al. | |
| 6,069,376 A | 5/2000 | Merrill | |
| 6,140,630 A | 10/2000 | Rhodes | |
| 6,204,524 B1 | 3/2001 | Rhodes | |
| 6,246,436 B1 | 6/2001 | Lin et al. | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,429,470 B1 | 8/2002 | Rhodes | |
| 6,445,022 B1 | 9/2002 | Barna et al. | |
| 6,512,544 B1 | 1/2003 | Merrill et al. | |

FOREIGN PATENT DOCUMENTS

EP    0 498 664 A1    8/1992
EP    1 231 641 A1    8/2002

*Primary Examiner*—Stephone B. Allen
(74) *Attorney, Agent, or Firm*—Dickstein Shapiro Morin & Oshinsky LLP

(57) ABSTRACT

An imager with dual conversion gain floating diffusion regions. The dual conversion gain regions yield (1) high conversion gain and sensitivity to achieve excellent low light performance and (2) high full well capacity and conversion gain to achieve high dynamic range. A dual conversion gain element is coupled between each floating diffusion node and a respective capacitor. The dual conversion gain element switches in the capacitance of the capacitor to change the conversion gain of the floating diffusion node from a first conversion gain to a second conversion gain. The imager may be a CMOS or CCD type imager.

121 Claims, 16 Drawing Sheets

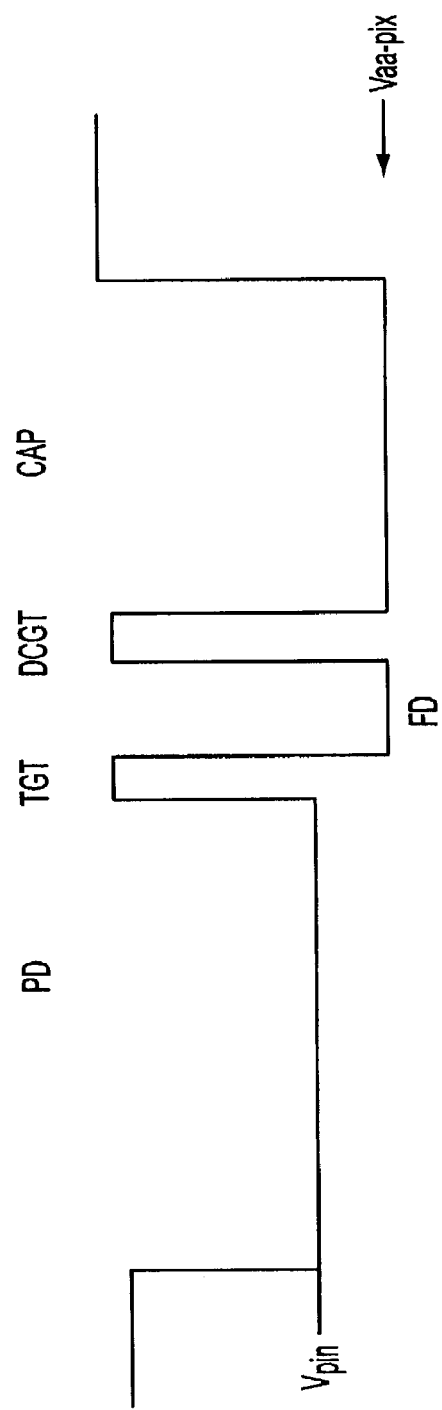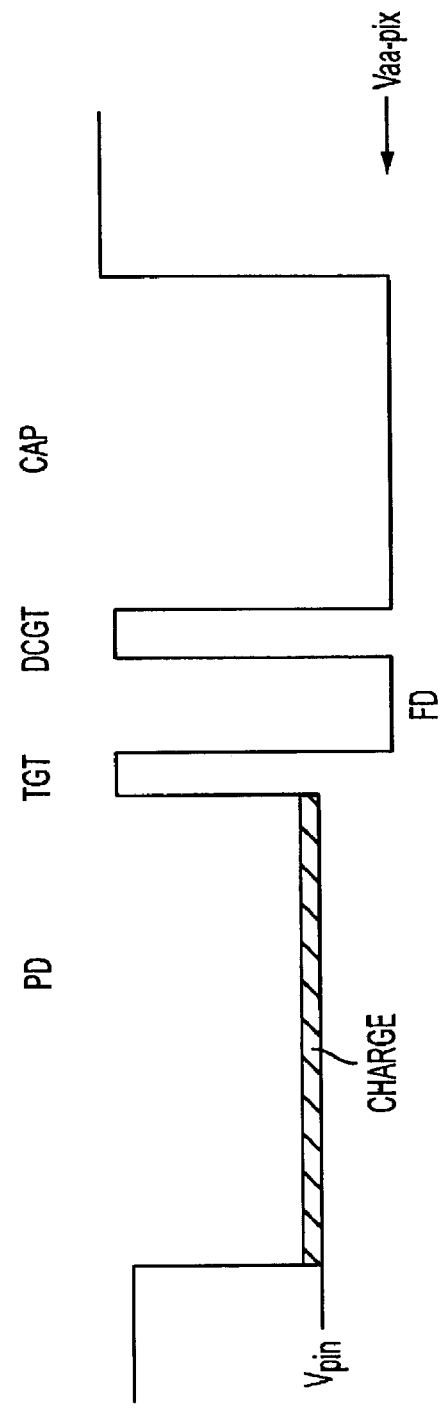

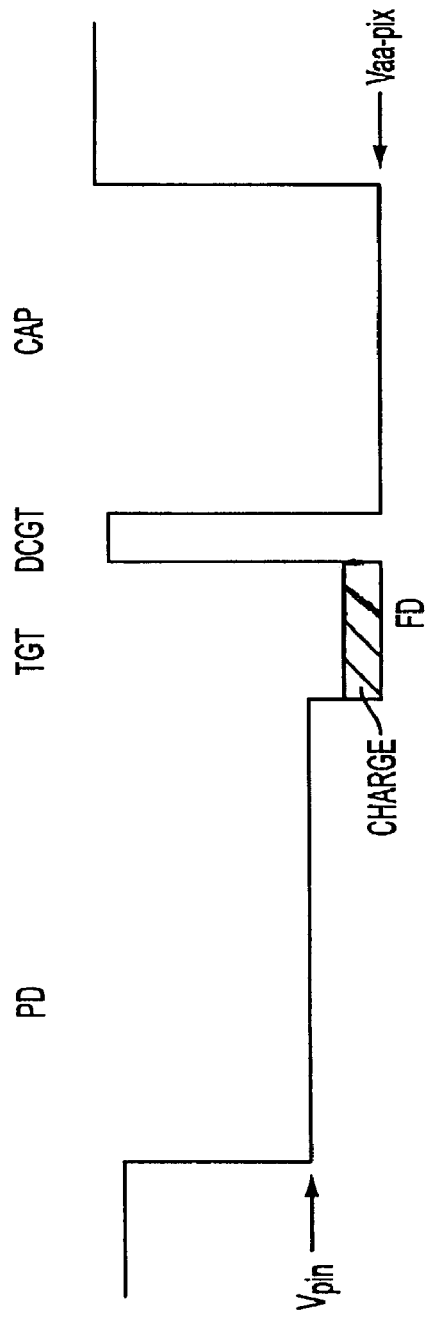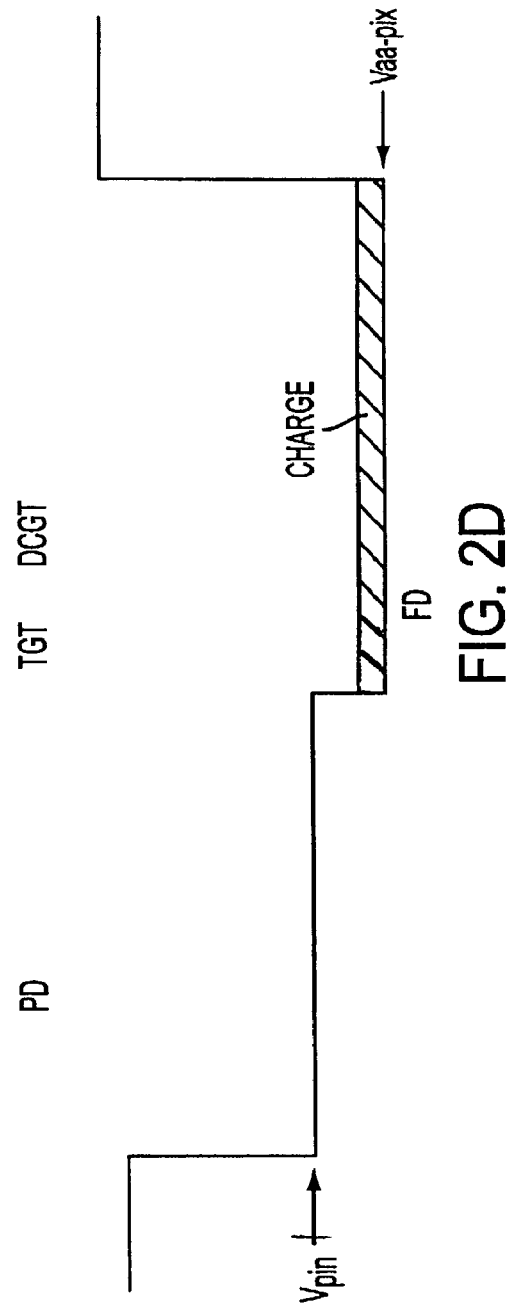

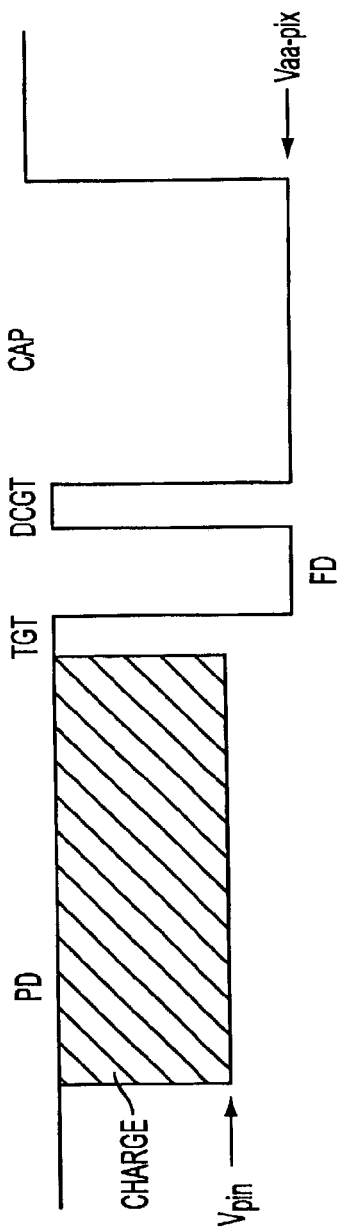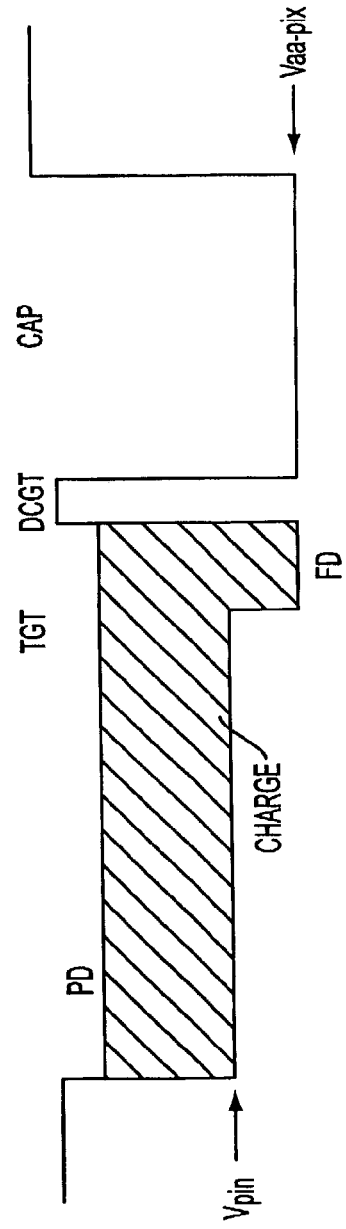

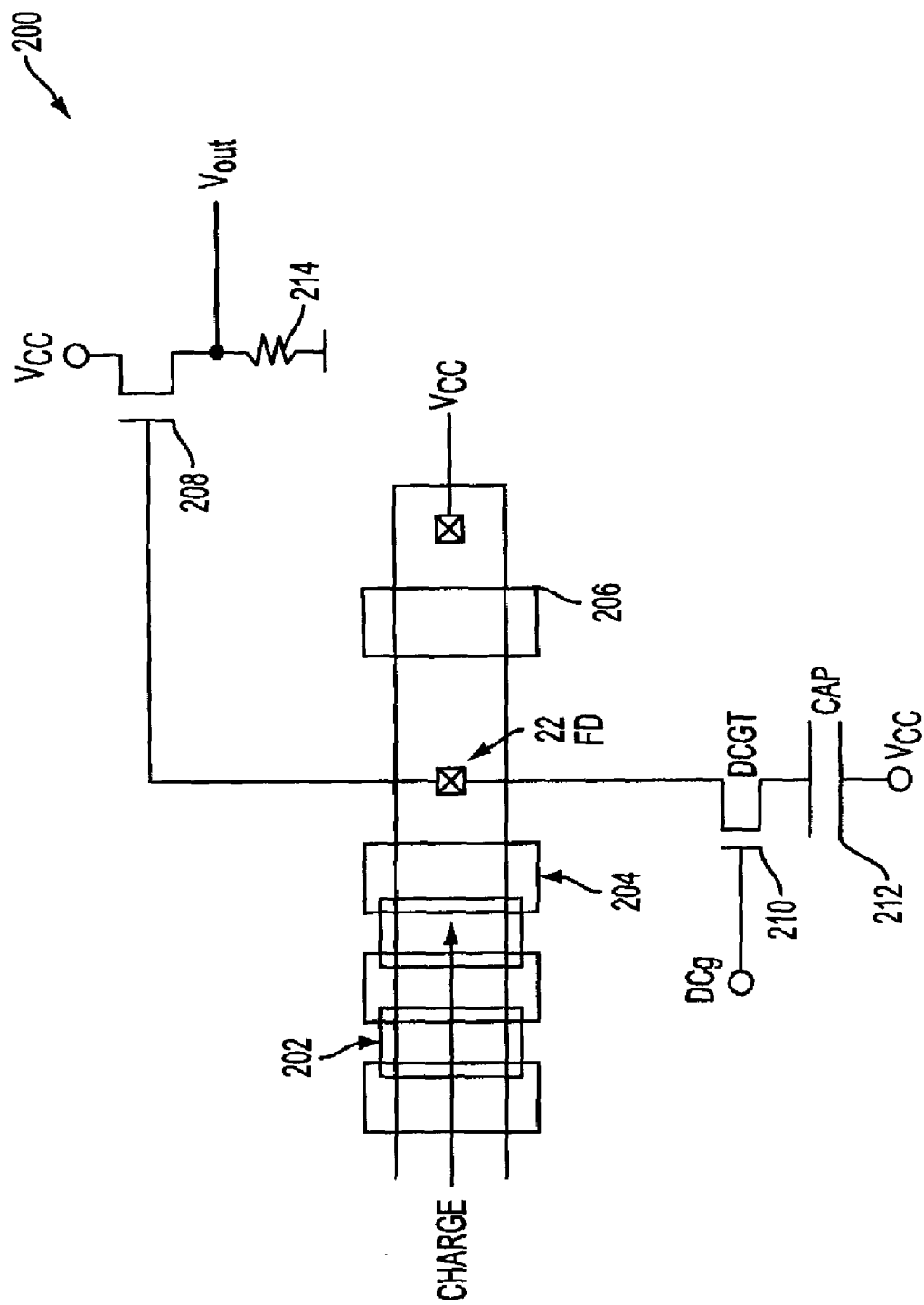

DUAL CONVERSION GAIN IMAGERS

FIELD OF THE INVENTION

The invention relates generally to imaging devices, and more particularly to dual conversion gain imaging devices.

BACKGROUND

Imaging devices, including charge coupled devices (CCD) and complementary metal oxide semiconductor (CMOS) imagers, are commonly used in photo-imaging applications.

A CMOS imager circuit includes a focal plane array of pixel cells. Each one of the cells includes a photoconversion device or photosensor such as, for example, a photogate, photoconductor, or photodiode, for generating and accumulating photo-generated charge in a portion of the substrate of the array. A readout circuit is connected to each pixel cell and includes at least an output transistor, which receives photo-generated charges from a doped diffusion region and produces an output signal that is read-out through a pixel access transistor.

One typical CMOS imager pixel circuit, the three-transistor (3T) pixel, contains a photosensor for supplying photo-generated charge to a diffusion region; a reset transistor for resetting the diffusion region; a source follower transistor having a gate connected to the diffusion region, for producing an output signal; and a row select transistor for selectively connecting the source follower transistor to a column line of a pixel array. Another typical CMOS imager pixel employs a four-transistor (4T) configuration, which is similar to the 3T configuration, but utilizes a transfer transistor to gate charges from the photosensor to the diffusion region and the source follower transistor for output.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing are hereby incorporated by reference herein in their entirety.

There are two general types of imagers. The first type combines a low capacitance photosensor and a low capacitance floating diffusion region. This combination results in an imager with high conversion gain and excellent low light sensitivity, but poor dynamic range and low fill well capacity. A second type of imager combines a high charge capacity photosensor with a high charge capacity floating diffusion region to achieve high full well capacity and dynamic range. This imager, however, has a low conversion gain and poor low light sensitivity.

Accordingly, there is a need and desire for an imager with both excellent low light performance and high dynamic range.

SUMMARY

The present invention provides an imager with improved low light performance and high dynamic range.

The above and other features and advantages are achieved in various embodiments of the invention by providing an imager with dual conversion gain floating diffusion regions. The dual conversion gain regions yield (1) high conversion gain and sensitivity to achieve excellent low light performance and (2) high full well capacity and conversion gain to achieve high dynamic range. A dual conversion gain element is coupled between each floating diffusion node and a respective capacitor. The dual conversion gain element switches in the capacitance of the capacitor to change the conversion gain of the FD node from a first conversion gain to a second conversion gain. The imager may be a CMOS or CCD type imager.

BRIEF DESCRIPTION OF THE DRAWINGS

The foregoing and other advantages and features of the invention will become more apparent from the detailed description of exemplary embodiments provided below with reference to the accompanying drawings in which:

FIGS. 2a–2d are potential diagrams representing the transfer of charge during an operation of the pixel illustrated in FIG. 1a under a first light condition;

FIG. 3 is a timing diagram of an operation of the pixel illustrated in FIG. 1a;

FIGS. 4a–4c are potential diagrams representing the transfer of charge during an operation of the pixel illustrated in FIG. 1a under a second light condition;

FIG. 5a is a graph illustrating pixel signals v. light exposure during an operation of the pixel illustrated in FIG. 1a;

FIG. 5b is graph illustrating adjusted pixel signal v. light induced electrons during an operation of the pixel illustrated in FIG. 1a;

FIG. 6 illustrates a top view of an exemplary layout of the pixel illustrated in FIG. 1a;

FIG. 11 is a portion of a CCD imager constructed in accordance with an exemplary embodiment of the invention;

DETAILED DESCRIPTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

The terms "wafer" and "substrate" are to be understood as interchangeable and as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

The term "pixel" refers to a photo-element unit cell containing a photoconversion device or photosensor and transistors for processing an electrical signal from electromagnetic radiation sensed by the photoconversion device. The pixels discussed herein are illustrated and described as inventive modifications to four transistor (4T) pixel circuits for the sake of example only. It should be understood that the invention is not limited to a four transistor (4T) pixel, but may be used with other pixel arrangements having fewer (e.g., 3T) or more (e.g., 5T) than four transistors. Although the invention is described herein with reference to the architecture and fabrication of one pixel, it should be understood that this is representative of a plurality of pixels in an array of an imager device. In addition, although the invention is described below with reference to a CMOS imager, the invention has applicability to any solid state imaging device having pixels. The following detailed description is, therefore, not to be taken in a limiting sense, and the scope of the present invention is defined only by the appended claims.

Figure 1A:
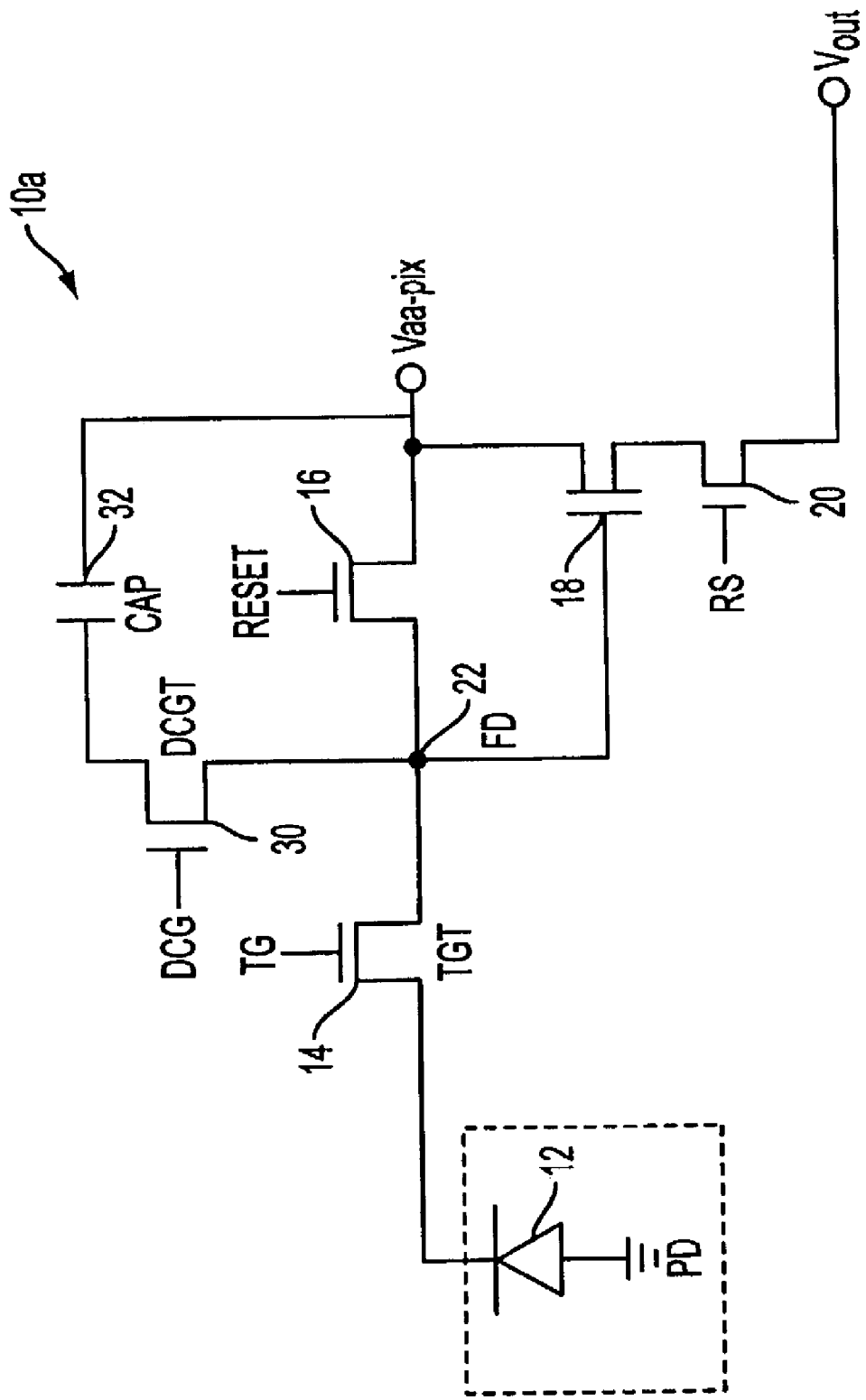
FIGS. 1a–1d are CMOS imager pixels constructed in accordance with exemplary embodiments of the invention.

Now referring to the figures, where like reference numbers designate like elements, FIG. 1a shows an exemplary embodiment of a CMOS imager pixel 10a of the invention. Similar to most 4T pixels, the pixel 10a includes a photosensor 12, floating diffusion node 22 (FD), transfer transistor 14 or transfer gate (TGT), reset transistor 16, source follower transistor 18 and row select transistor 20. In the illustrated embodiment, however, the pixel 10a also includes a dual conversion gain element configured as a transistor 30 (DCGT) and an in-pixel capacitor 32 (CAP). Thus, the pixel 10a is configured as a novel 5T pixel, the operation of which is described below in more detail. As will become apparent, the dual conversion gain transistor 30 and capacitor 32 form a conversion gain altering circuit for the floating diffusion node 22.

The photosensor 12 is a high charge capacity photosensor. The high charge capacity photosensor 12 may be a photodiode with a high pinning voltage Vpin, a photodiode connected to a capacitor, a photogate, or any similar photosensitive device with a high charge capacity. In the illustrated embodiment, the high charge capacity photosensor 12 is a photodiode (PD) with a high Vpin (e.g., 2.3 volts). It should be appreciated, however, that any of the aforementioned photosensors could be used to practice the invention. The photosensor 12 is coupled to the floating diffusion node 22 via the transfer transistor 14. It is desirable for the floating diffusion node 22 to have a low capacitance such that it has a high conversion gain of 20 µV/e to 150 µV/e or preferably 30 µV/e to 70 µV/e.

The combination of the high charge capacity photosensor 12 and low capacitance floating diffusion node 22 is a novel approach and provides a high dynamic range to the pixel 10a as will become apparent below. In the past, this combination is avoided because the low capacitance floating diffusion node 22 does not have enough charge handling capacity to receive all the collected electrons from the high charge capacity photosensor 12. In the past, this combination also creates charge sharing and lag issues if exposed to bright light, which are typically to be avoided when designing a pixel due to the image degradation caused by the charge sharing and lag issues. However, as will be discussed below, the use of the high charge capacity photosensor 12 and low capacitance floating diffusion node 22 provides necessary benefits when used in conjunction with the dual conversion gain transistor 30 and capacitor 32.

The dual conversion gain transistor 30 has its source terminal connected to the floating diffusion node 22 and its drain connected to a first side of the in-pixel capacitor 32. The gate of the dual conversion gain transistor 30 is connected to a dual conversion gain control signal DCG. The second side of the capacitor is connected to the array pixel supply voltage Vaa-pix. U.S. Pat. No. 6,429,470 to Rhodes, the disclosure of which is hereby incorporated by reference in its entirety, describes a preferred storage capacitor that may be used as the in-pixel capacitor 32. It is desirable that the capacitance of the capacitor 32 is set such that $Q_{PD} \leq Q_{CAP} + Q_{FD}$, where $Q_{PD}$ is the charge handling capacitance of the photosensor 12, $Q_{CAP}$ is the charge handling capacitance of the capacitor 32 and $Q_{FD}$ is the charge handling capacitance of the floating diffusion node 22. The dual conversion gain signal (DCG) is generated by the image processor or other control circuit that is controlling the operation of the pixel. This processor or control circuit may utilize additional photosensors or non-imaging pixels to determine the amount of light being processed and to generate the signal accordingly (as discussed below).

The capacitance of the capacitor 32 is switched into the pixel 10a and coupled to the floating diffusion node 22 when the image processor (or other control circuitry) applies the dual conversion gain control signal DCG to turn on the dual conversion gain transistor 30. As will become apparent below, the DCG signal may be generated at different times depending upon the application and/or user preferences. Once the capacitor 32 is coupled to the floating diffusion node 22, the conversion gain of the floating diffusion node 22 will decrease from approximately 20–150 µV/e to approximately 2–20 µV/e. Thus, the floating diffusion node 22 has a second conversion gain when the dual conversion gain signal DCG turns on the dual conversion gain transistor 30. As such, the dual conversion gain transistor 30 and capacitor 32 form a conversion gain altering circuit for the floating diffusion node 22.

Figure 1B:
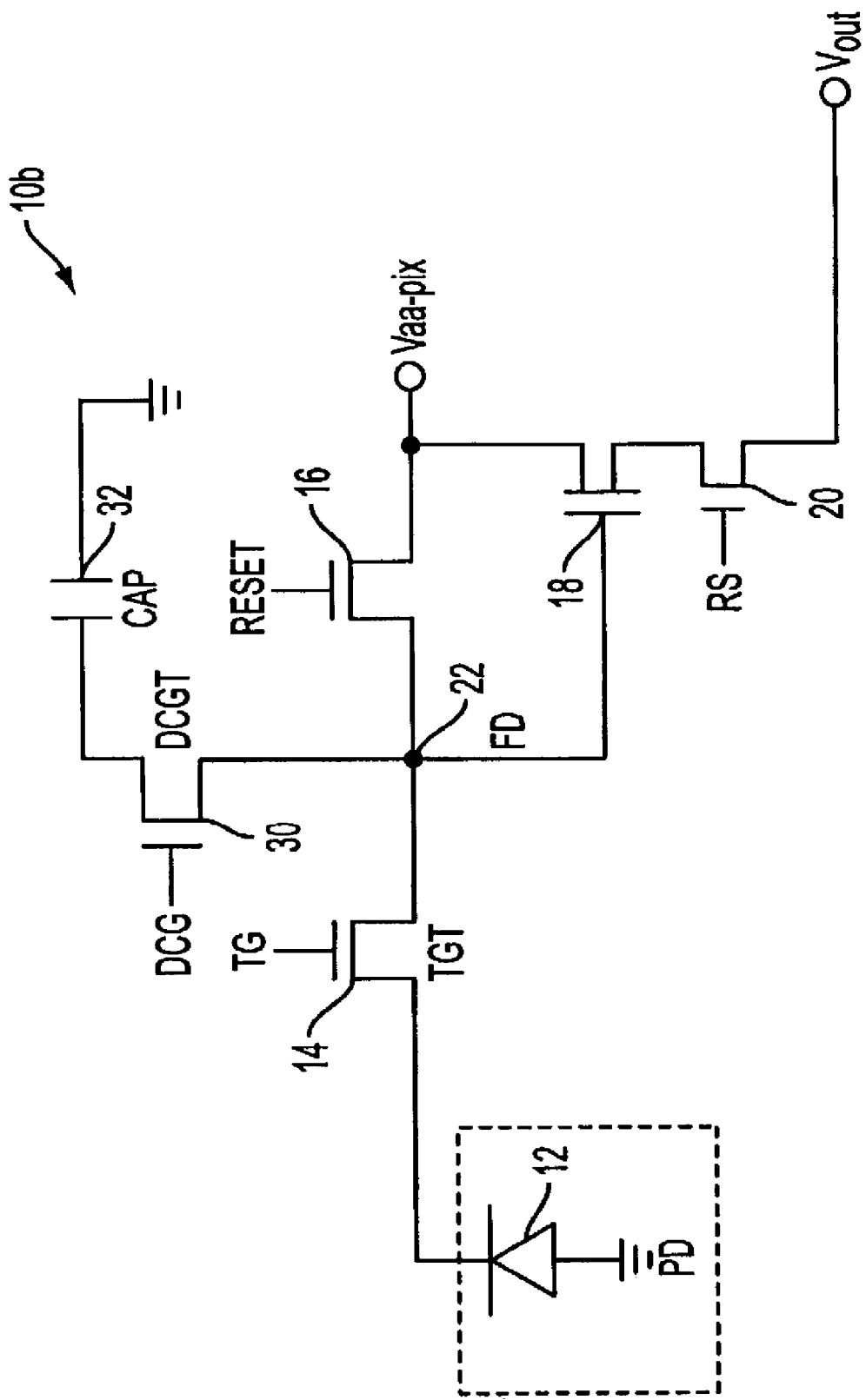
Figure 1C:
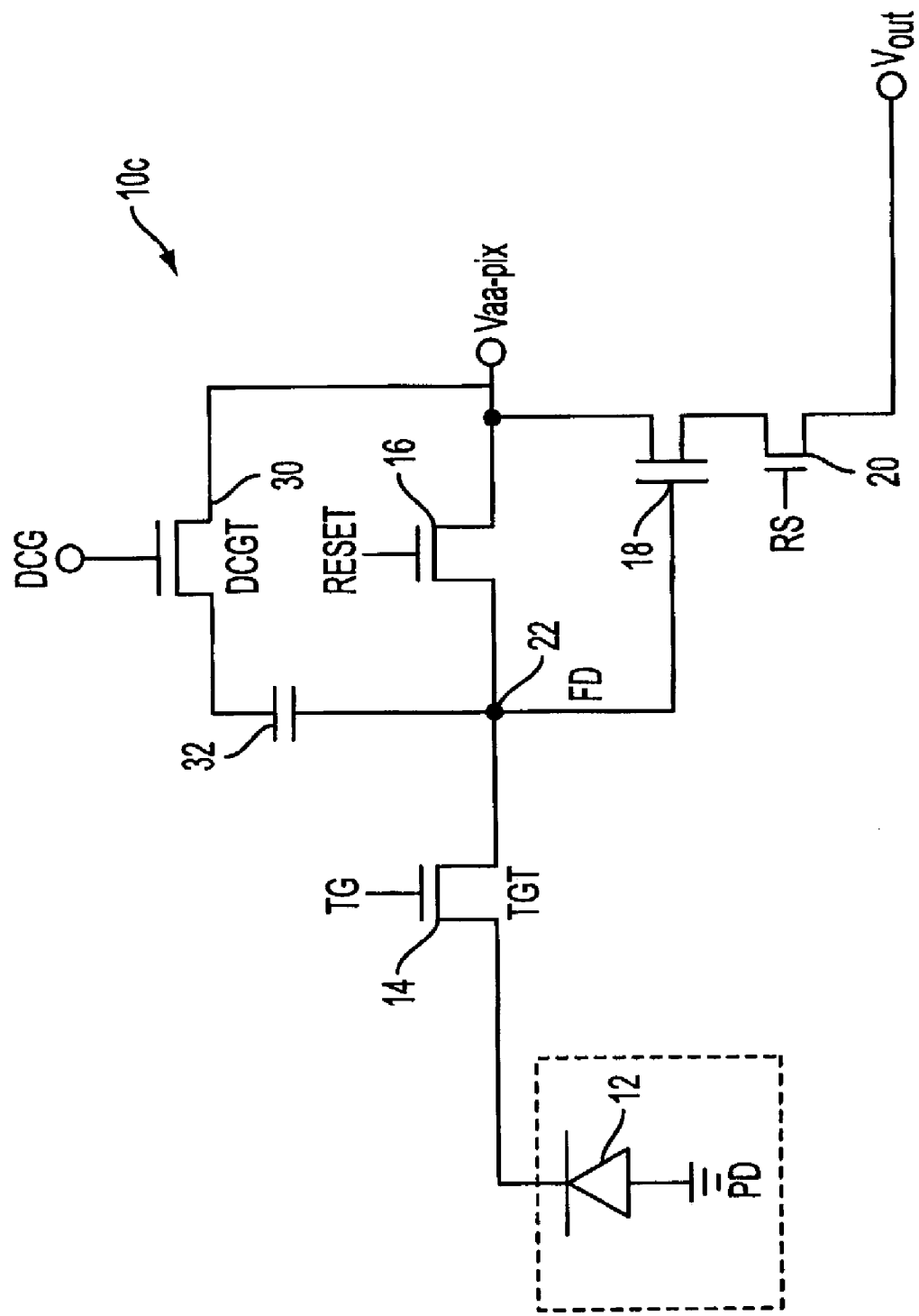
Figure 1D:
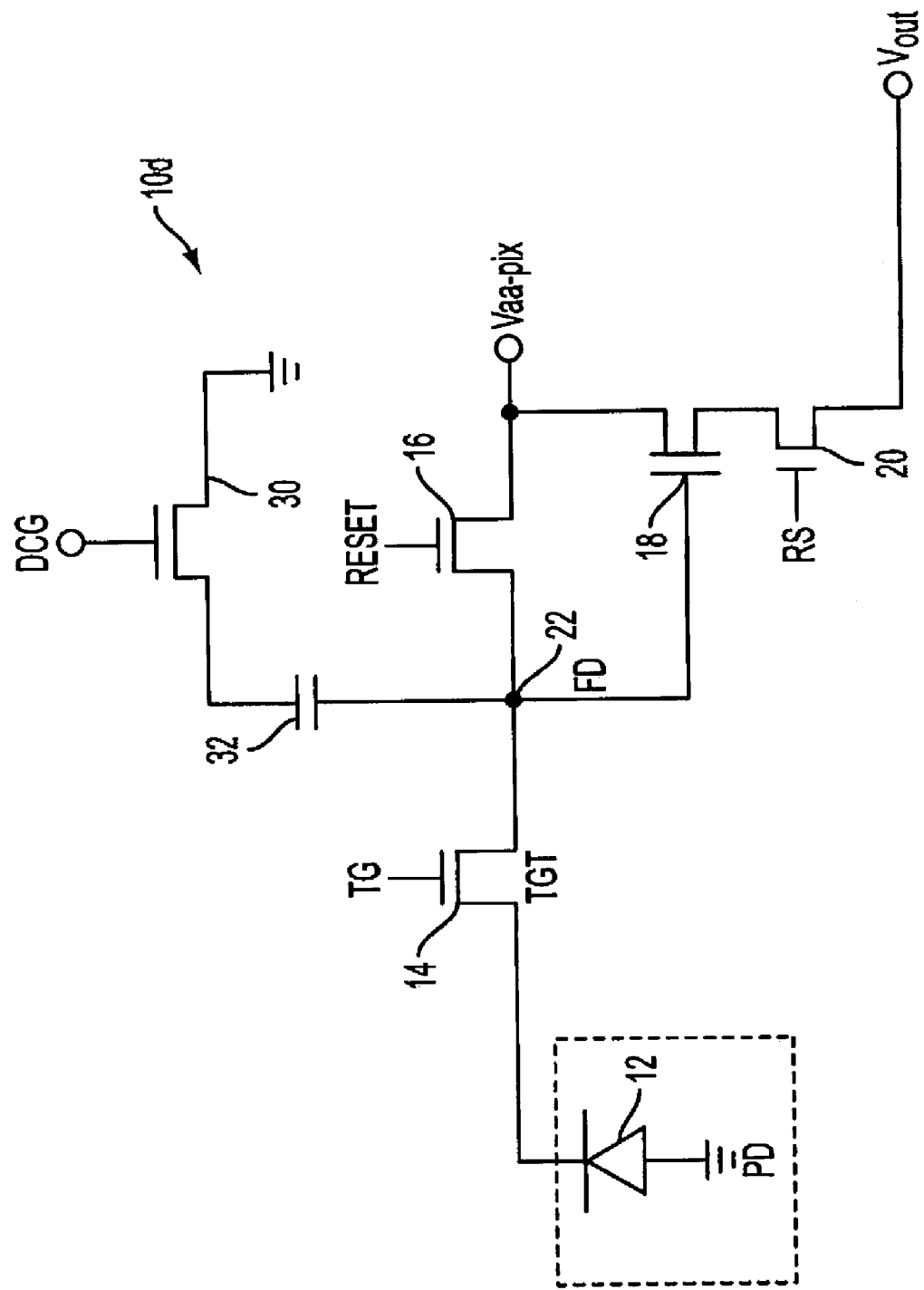

FIGS. 1b–1d illustrate other exemplary embodiments of the invention. FIG. 1b illustrates a pixel 10b in which the capacitor 32 is coupled between the dual conversion gain transistor 30 and ground (rather than the array pixel supply voltage Vaa-pix). FIG. 1c illustrates a pixel 10c in which the positioning of the capacitor 32 and the dual conversion gain transistor 30 are switched (relative to their positions in the FIGS. 1a and 1b pixels 10a, 10b). FIG. 1d illustrates another exemplary pixel 10d in which the positioning of the capacitor 32 and the dual conversion gain transistor 30 are switched (relative to their positions in the FIGS. 1a and 1b pixels 10a, 10b) with the modification that the dual conversion gain transistor 30 is coupled to ground (instead of the array pixel supply voltage Vaa-pix).

The remaining circuitry of the pixels 10a, 10b, 10c, 10d is connected as follows. The reset transistor 16 is connected between the floating diffusion node 22 and the array pixel supply voltage Vaa-pix (e.g., 3.3 volts). A reset control signal RESET is used to activate the reset transistor 16, which resets the photosensor 12 and floating diffusion node 22 as is known in the art. For simplicity, we activate the reset transistor 16 with an "on" voltage of Vaa-pix+Vt-reset, where Vt-reset is the transistor threshold voltage of the reset transistor 16, typically 0.7 volts. This "overdriving" of the reset transistor 16 allows the floating diffusion node 22 to be reset to the array pixel supply voltage Vaa-pix. This is advantageous, but not a necessary requirement to practice the invention. The source follower transistor 18 has its gate connected to the floating diffusion node 22 and is connected between the array pixel supply voltage Vaa-pix and the row select transistor 20. The source follower transistor 18 converts the stored charge at the floating diffusion node 22 into an electrical output voltage signal Vout. The row select transistor 20 is controllable by a row select signal RS for selectively collecting the source follower transistor 18 and the output voltage signal Vout to a column line of a pixel array.

Figure 3:
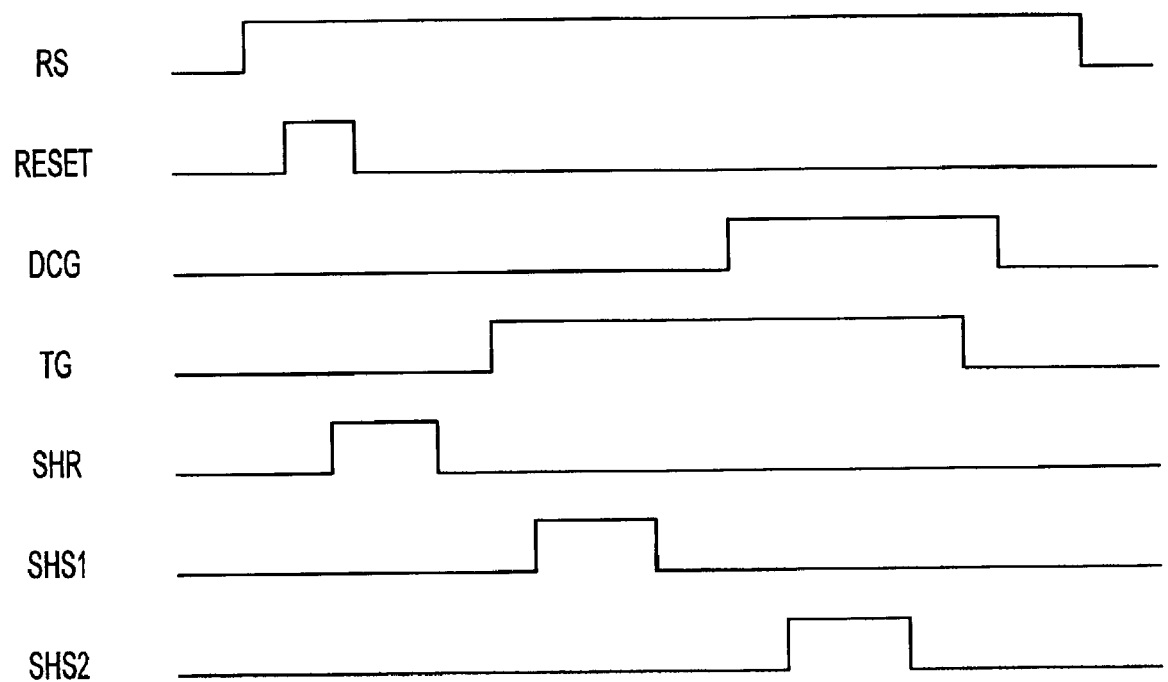

An example of the operation of the pixel 10a (FIG. 1a) under low light exposure is now described with reference to FIGS. 1a, 2a–2d and 3. FIGS. 2a–2d are potential diagrams representing the transfer of charge during an operation of the pixel 10a under a first light condition. FIG. 3 is a timing diagram of the operation of the pixel 10a.

Initially, the row in which the pixel 10a resides is selected upon the activation of the appropriate row select signal RS. The floating diffusion node 22 (FD) and capacitor 32 (CAP) of the activated row are reset by the pulsing on both the reset and dual conversion gain transistors 16, 30. The reset and dual conversion gain transistors 16, 30 are then turned on to establish the potential diagram shown in FIG. 2a. The illustrated floating diffusion node (FD) is reset to a voltage of Vaa-pix. A first sample and hold signal SHR is generated such that sample and hold circuitry connected to a column line of the imager would input, sample and hold any signal at the output of the source follower transistor 18 associated with the reset pixel 10a.

Once reset, the pixel 10a is exposed to light coming from the image being processed. The potential diagram of FIG. 2b illustrates stored charge in the PD region caused by low light exposure. For a low light exposure, the photodiode charge capacity well is only slightly filled with the light-generated electrons. A transfer gate control signal TG turns on the transfer transistor 14 (TGT), which causes the charge stored in the PD to transfer into the FD node as shown in FIG. 2c. At this point, the floating diffusion node 22 (FD) has a low capacitance and a high conversion gain because the dual conversion gain transistor 30 remains off. All the electrical charge is transferred from the PD to the FD and there is no charge sharing because the light exposure is low and because Vaa-pix>Vpin. Another sample and hold signal SHS1 is generated such that sample and hold circuitry to a column line of the imager would input, sample, and hold the signal associated with the transferred charge (via transistor 18). Correlated double sampling may then be used to subtract the sampled exposure signal (SHS1) from the sampled reset signal (SHR) to determine the pixel signal output value change as a result of light exposure to the pixel 10a.

After the SHS1 signal is read, and while the transfer gate control signal TG maintains the transfer transistor 14 (TGT) in the on state, the dual conversion gain signal DCG is generated, which activates the dual conversion gain transistor 30 (DCGT) and switches in the capacitance of the capacitor 32 (CAP) as shown by the potential diagram of FIG. 2d. An extremely low signal on the floating diffusion node 22 (FD) results from the added capacitance of the capacitor 32 (CAP). Another sample and hold signal SHS2 is generated such that sample and hold circuitry to a column line of the imager would input, sample, and hold the signal associated with this low light charge (via transistor 18) with the dual conversion gain transistor 30 now turned "on." Correlated double sampling may then be used to subtract the sampled exposure signal (SHS2) from the sampled reset signal (SHR) determine the pixel signal output value change as a result of light exposure to the pixel 10a. The image processor may use this pixel output signal change, the previously computed output signal change, or a combination of the two signals depending upon the application. In this manner, a dual conversion gain image sensor is achieved. The light signal is first sensed as SHS1-SHR with a high conversion gain floating diffusion node (FD) and then sampled again as SHS2-SHR with a low conversion gain floating diffusion node (FD).

Figure 4C:
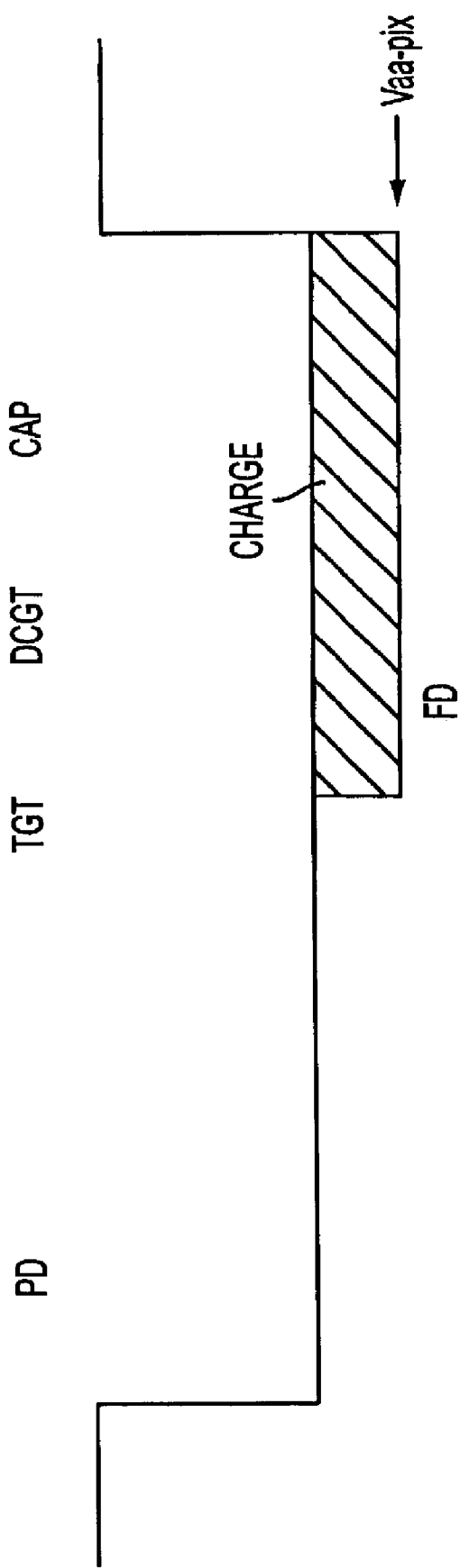

An example of the operation of the pixel 10a under bright or intense light exposure is now described with reference to FIGS. 1a, 3 and 4a–4c. Initially, pixel 10a is reset and the signal associated with the reset condition are obtained as described above with reference to FIG. 2a. Once reset, the pixel 10a is exposed to light coming from the image being processed. The potential diagram of FIG. 4a illustrates a charge saturated PD caused by the bright light exposure. The PD charge capacity well is completely filled by electrons generated by the light exposure. A transfer gate control signal TG turns on the transfer transistor 14 (TGT), which causes charge sharing between the PD and the floating diffusion node (FD) as shown in FIG. 4b. Charge sharing occurs because the charge handling capacitance of the floating diffusion node 22 (FD) is less than the charge handling capacitance of the photosensor 12. A sample and hold signal SHS1 is generated such that sample and hold circuitry connected to a column line of the imager would input, sample, and hold the signal associated with the saturated shared charge (via transistor 18). Correlated double sampling may then be used to subtract the sampled exposure signal (SHS1) from the sampled reset signal (SHR) to determine the pixel signal output value change as a result of the light exposure to the pixel 10a.

After the signal is read, and while the transfer gate control signal TG maintains the transfer transistor 14 (TGT) in the on state, the dual conversion gain signal DCG is generated, which activates the dual conversion gain transistor 30 (DCGT) and switches in the charge handling capacitance of the capacitor 32 (CAP). Now, the charge handling capacitance of the PD is less than the combined charge handling capacitance of the floating diffusion node 22 (FD) and capacitor 32. This means that there can now be a fill charge transfer to the floating diffusion node 22, which is now a low conversion gain node due to the additional capacitance as shown in FIG. 4c. This allows the sampling of a high full well signal when the sample and hold signal SHS2 is generated. Correlated double sampling may then be used to determine the pixel signal output value change.

In order to avoid charge sharing and resulting lag issues under bright light exposure, the capacitor 32 (CAP) must be carefully chosen. We define the charge handling capacitance of the pinned photodiode to be:

$$Q_{PD} = \int_0^{Vpin} C_{PD} dV.$$

The charge handling capacity of the floating diffusion node 22 (FD) is:

$$Q_{FD} = \int_{Vpin}^{Vaa-pix} C_{FD} dV.$$

The charge handling capacity of the capacitor 32 (CAP) is: $Q_{CAP}=C_{CAP}[Vaa-pix-Vpin]$. As long as the capacitance $C_{CAP}$ of the capacitor 32 is chosen such that $Q_{PD}<Q_{FD}+Q_{CAP}$ there will be no charge sharing under bright light exposures when SHS2 is measured and no resulting image lag issues. While under certain timing applications it is advantageous to appropriately set the capacitance $C_{CAP}$ of the in-pixel capacitor 32 (CAP), this is not a requirement to practice the invention.

Figure 5A:
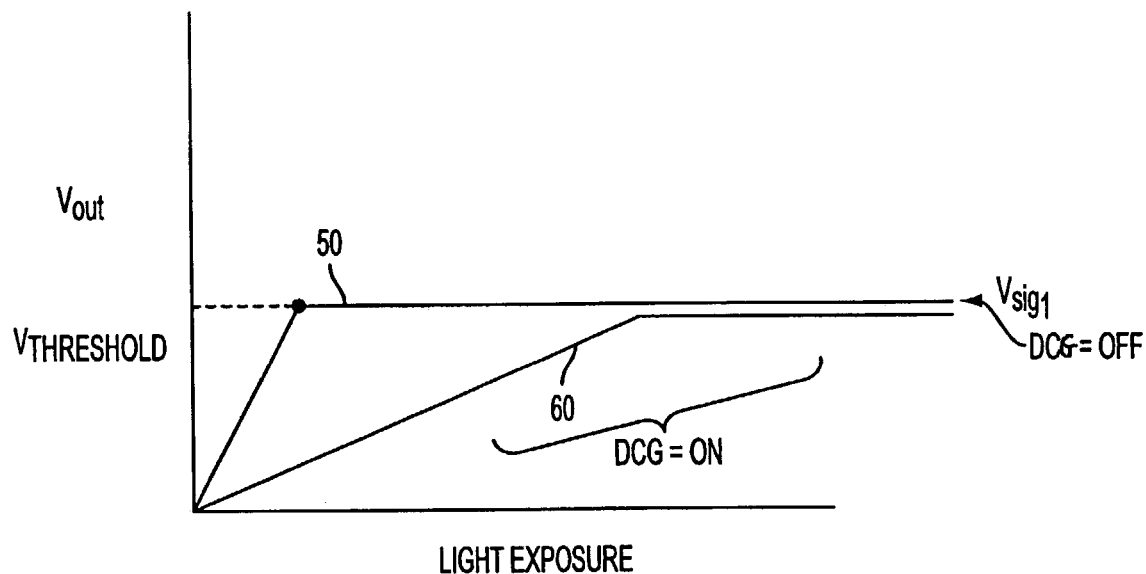
Figure 5B:
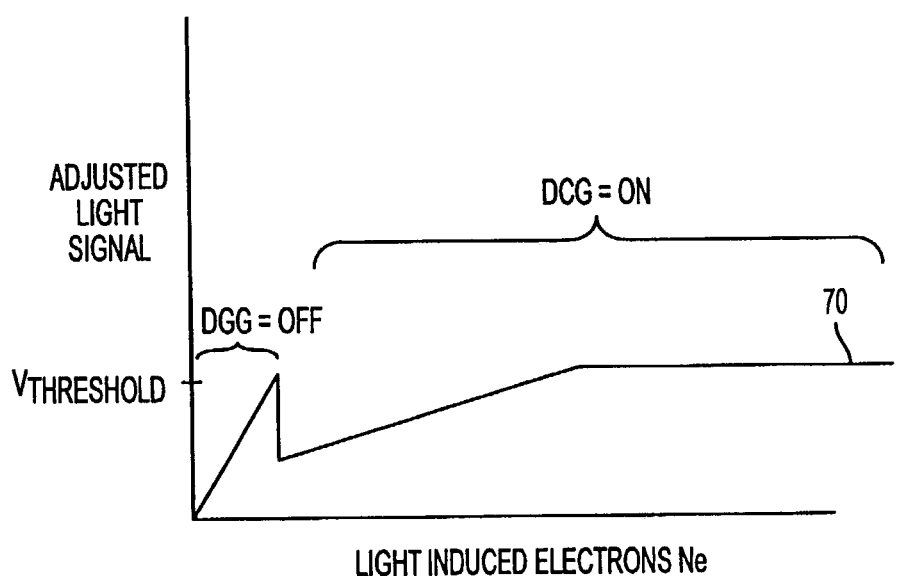

FIG. 5a is a graph illustrating pixel signals v. light exposure during the operation of the pixel 10a illustrated in FIG. 1a. Line 50 illustrates the signal associated with the charge stored in the floating diffusion node 22 when the dual conversion gain transistor 30 is off. That is, when the floating diffusion node 22 has a low capacitance and high conversion gain, line 50 reflects that the output signal Vout becomes saturated once a certain threshold is reached, which in the illustrated example is about Vthreshold=Vaa-pix–Vpin=3.3 volts–2.3 volts=1.0 volts. This is a signal (SHS1-SHR) associated with an approximately 20 Ke charge corresponding to the illustrated example of a high conversion gain of 50 µV/e. At this point, the signal to noise ratio (S/N) is approximately 140 db, which is an acceptable ratio. Line 60 shows the signal associated with the charge stored in the floating diffusion node 22 when the dual conversion gain transistor 30 is on. That is, when the floating diffusion node 22 has a high capacitance and low conversion gain, line 60 reflects that the output signal Vout does not become saturated at the 20 Ke threshold. If the low conversion gain is set to 5 µV/e then the output (SHS2-SHR) does not become saturated until 200 Ke are collected. At this point, the S/N will have increased to 447. If the readout noise is e.g., 5e, then the dynamic range achieved is 100 db. FIG. 5b is graph illustrating an adjusted pixel signal 70 that results when the floating diffusion node 22 initially has a high conversion gain that is subsequently switched to a low conversion gain (as discussed above with reference to FIGS. 1–4). The light dynamic range has been improved by ten times. It now takes 10 times more light photons to achieve a saturated SHS2-SHR output signal. While FIG. 5b shows a drop in output signal when the dual conversion gain transistor is turned on, the performance measured by the signal to noise ratio (S/N) is not degraded. In the example description of the operation and timing of this invention, three sample and hold capacitors are required to store the three signals SHR, SHS1 and SHS2.

Figure 6:
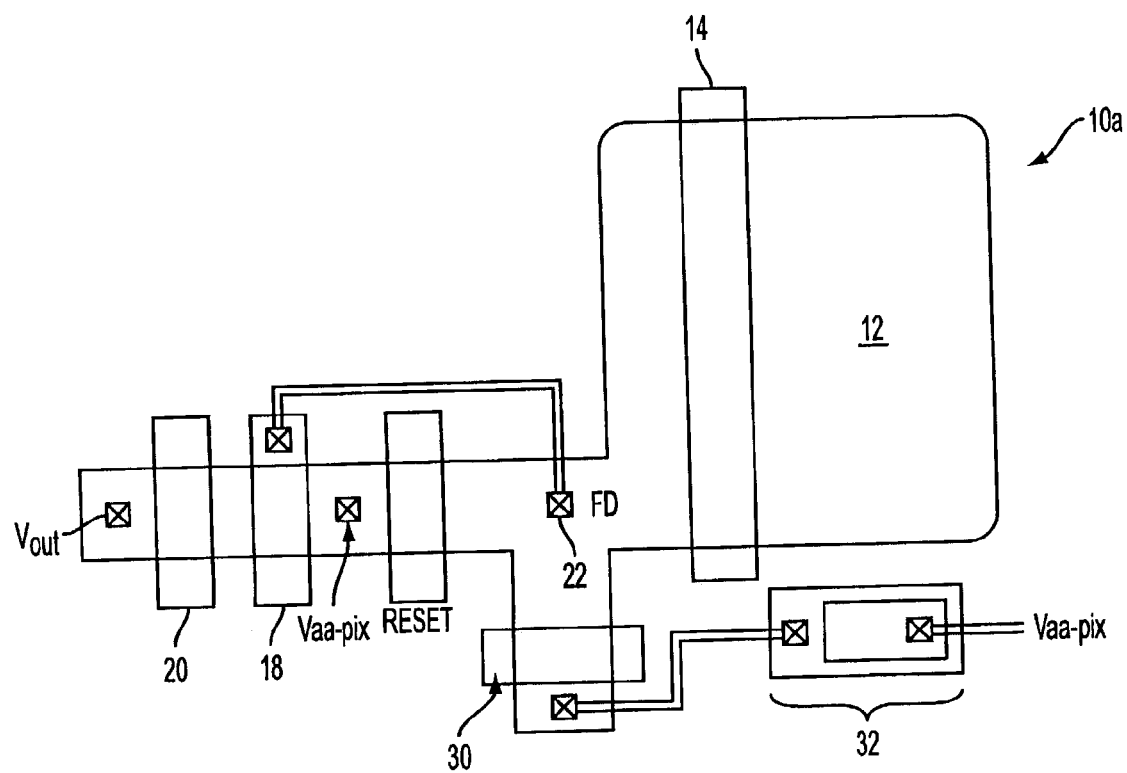

FIG. 6 illustrates a top view of an exemplary layout of the five transistor (5T) pixel 10a illustrated in FIG. 1a. As noted above, the capacitor 32 is preferably an in-pixel capacitor which may be constructed in accordance with U.S. Pat. No. 6,429,470. It should be appreciated that the pixel 10a of the present invention does not require the transfer transistor 14.

That is, in another embodiment of the invention the photosensor 12 and the floating diffusion node 22 could be connected without an intervening transistor. The dual conversion gain transistor 30 and in-pixel capacitor 32 would be controlled in the same manner, would perform the same functions and would change the conversion gain of the floating diffusion node 22 in the same manner as described above with respect to FIGS. 1–5. Thus, the invention is not limited to a pixel containing a transfer gate or transfer transistor.

Another operating mode for the various embodiments of the invention is to set a user adjustable gain at the pixel level. That is, the dual conversion gain transistor 30 could be turned on or off for picture taking (as warranted by the light conditions). If the dual conversion gain transistor 30 is off, the conversion gain of the FD node is approximately 50 µV/e. If the dual conversion gain transistor 30 is on, the conversion gain of the FD is approximately 5 µV/e. In this operating mode, only two voltage levels are stored in the sample and hold circuitry: (1) a voltage level associated with the reset operation; and (2) the voltage level associated with the charge sent from the photosensor to the floating diffusion node 22.

Figure 7:
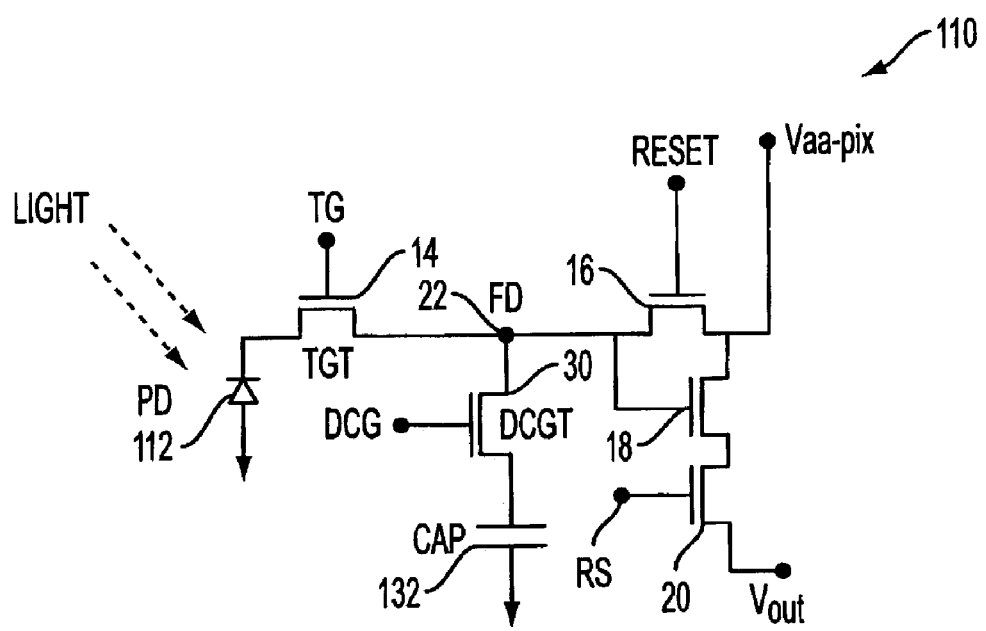
FIG. 7 is a CMOS imager pixel constructed in accordance with another exemplary embodiment of the invention.
Figure 8:
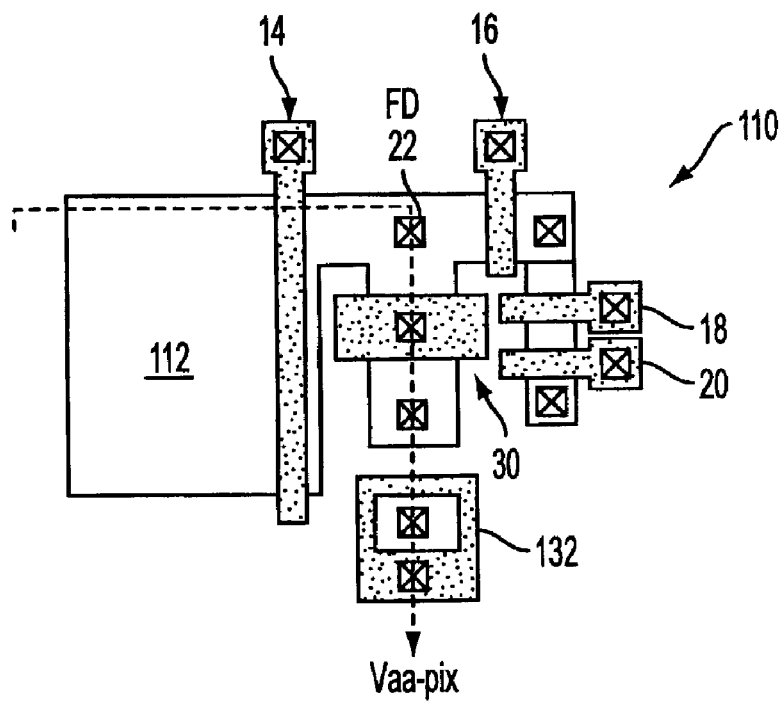
FIG. 8 illustrates an exemplary layout of the pixel illustrated in FIG. 7.

FIGS. 7–8 illustrate a CMOS imager pixel 110 constructed in accordance with another exemplary embodiment of the invention. The pixel 110 is essentially the same as the pixel 10a illustrated in FIG. 1a. The pixel 110 of the illustrated embodiment, however, uses a conventional polysilicon in-pixel capacitor 132 and any conventional photosensor 112. Although FIGS. 7–8 illustrate a five transistor (5T) pixel configuration, it should be appreciated that the transfer transistor 14 is not required to practice the invention.

Figure 9A:
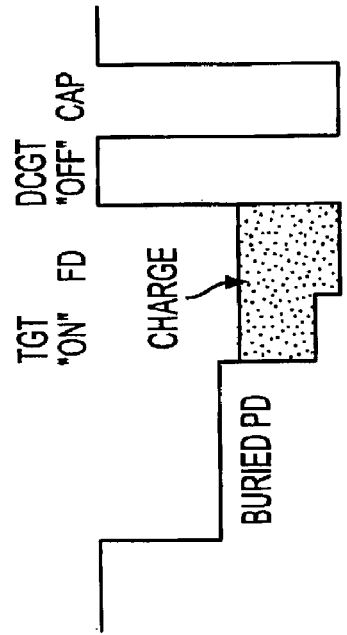
FIGS. 9a and 9b are potential diagrams representing the transfer of charge during an operation of the pixel illustrated in FIG. 7 under a first light condition.
Figure 9B:
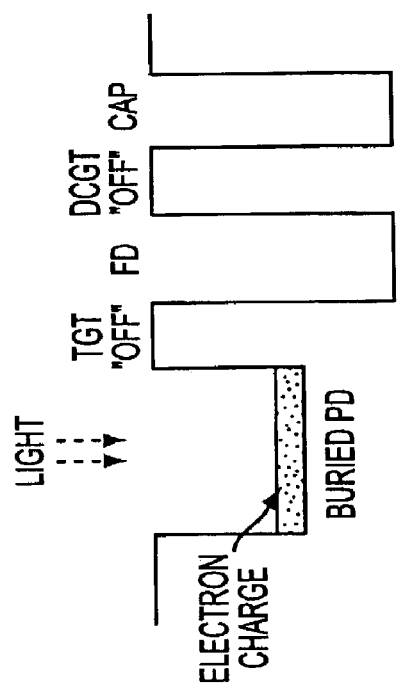

FIGS. 9a and 9b are potential diagrams representing the transfer of charge during an operation of the pixel 110 illustrated in FIG. 7 under a low light condition. The pixel 110 has been previously reset and is receiving an image signal. Once the photosensor is exposed to the low light, charge accumulates in the PD as shown in FIG. 9a. A transfer gate control signal TG turns on the transfer transistor 14 (TGT), which causes the charge stored in the PD to transfer into the floating diffusion node 22 (FD) as shown in FIG. 9b. At this point, the floating diffusion node 22 (FD) has a low capacitance and a high conversion gain. There is no charge sharing because the light exposure is low. Sample and hold circuitry connected to a column line of the imager would input, sample and hold the signal (via transistor 18) associated with the charge stored in the floating diffusion node 22. Correlated double sampling may then be used to determine the pixel signal output value.

As with the prior embodiments of the invention, when the photosensor is receiving low light signals, a high conversion gain is desirable. This is achieved by using only the low capacitance floating diffusion node 22 (i.e., the dual conversion gain transistor 30 is not turned on).

Figure 10A:
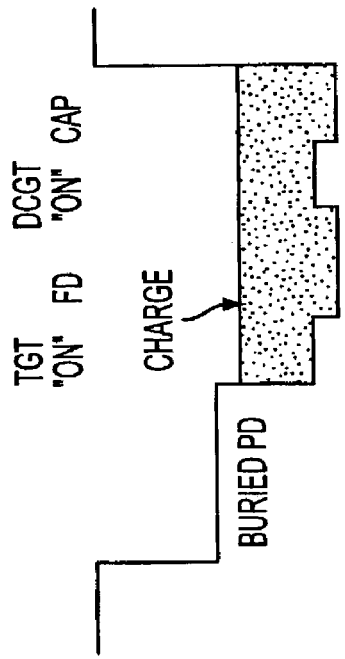
FIGS. 10a and 10b are potential diagrams representing the transfer of charge during an operation of the pixel illustrated in FIG. 7 under a second light condition.
Figure 10B:
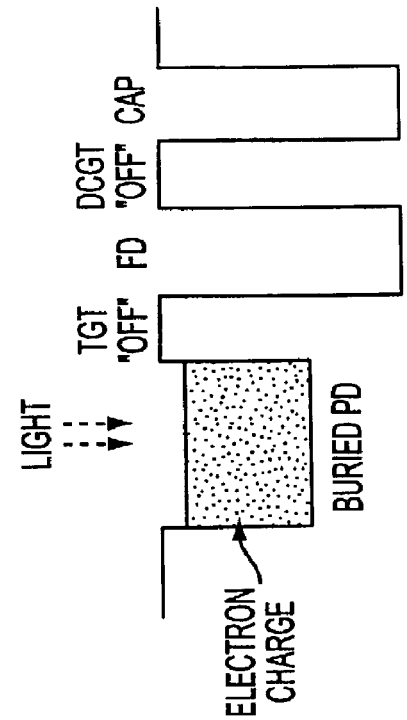

FIGS. 10a and 10b are potential diagrams representing the transfer of charge during an operation of the pixel 110 illustrated in FIG. 7 under a bright light condition. The pixel 110 has been previously reset and is receiving an image signal. Once the photosensor is exposed to the bright light, charge accumulates in the PD (FIG. 10a). The potential diagram of FIG. 10a illustrates a large amount of stored in the PD caused by the bright light exposure. A transfer gate control signal TG turns on the transfer transistor 14 and the dual conversion gain signal DCG activates the dual conversion gain transistor 30 (DCGT) to switch in the capacitance of the capacitor 132 (CAP). The dual conversion gain signal (DCG) is generated by the image processor or other control circuit that is controlling the operation of the pixel. The transfer gate control signal TG and the dual conversion gain signal DCG may be generated simultaneously or substantially simultaneously. Now, the charge handling capacitance of the PD is less than the combined charge handling capacitance of the floating diffusion node 22 and capacitor 132. This means that there can now be a full charge transfer to the floating diffusion node 22 node, which is now a low conversion gain node due to the additional charge handling capacitance. This allows the sampling of the high full well signal.

As noted above, the invention is not limited to CMOS imagers. For example, the dual conversion gain principles of the invention may be incorporated into a CCD imager. FIG. 11 is a portion of a CCD imager 200 constructed in accordance with an exemplary embodiment of the invention. The CCD imager 200 includes a shift register 202 for shifting charges input from a photosensitive device of the imager 200. The register 202 is often referred to as the charge coupled device of the CCD imager 200. A final or output stage 204 of the register 202 is coupled to the floating diffusion node 22. Coupled between the floating diffusion node 22 and a supply voltage Vcc is a gate 206 of a reset transistor. A source follower transistor 208 has its gate connected to the floating diffusion node 22. The source follower transistor 208 is coupled between the supply voltage Vcc and a load 214 and outputs a signal Vout corresponding to stored charge on the floating diffusion node 22. All of the circuitry described so far is conventional and known in the CCD imager art.

The illustrated imager 200 also includes a dual conversion gain transistor 210 (DCGT) and a capacitor 212 (CAP). The dual conversion gain transistor 210 is coupled between the floating diffusion node 22 and the capacitor 212 and is controlled by a dual conversion gain control signal DCG. The capacitor 212 is connected between the dual conversion gain transistor 210 and the supply voltage Vcc. In operation, the dual conversion gain transistor 210 and capacitor 212 are used to switch the conversion gain of the floating diffusion node 22 from a first or high conversion gain state (i.e., DCG is generated such that the dual conversion gain transistor 210 is off and capacitor 212 switched out of the imager 200) to a second or low conversion gain state (i.e., DCG is generated such that the dual conversion gain transistor 210 is on and capacitor 212 connected to the floating diffusion node 22). Thus, the dual conversion gain transistor 210 and capacitor 212 provide dual conversion gain capability to the CCD imager 200, which yields high dynamic range and excellent low light performance.

Figure 12:
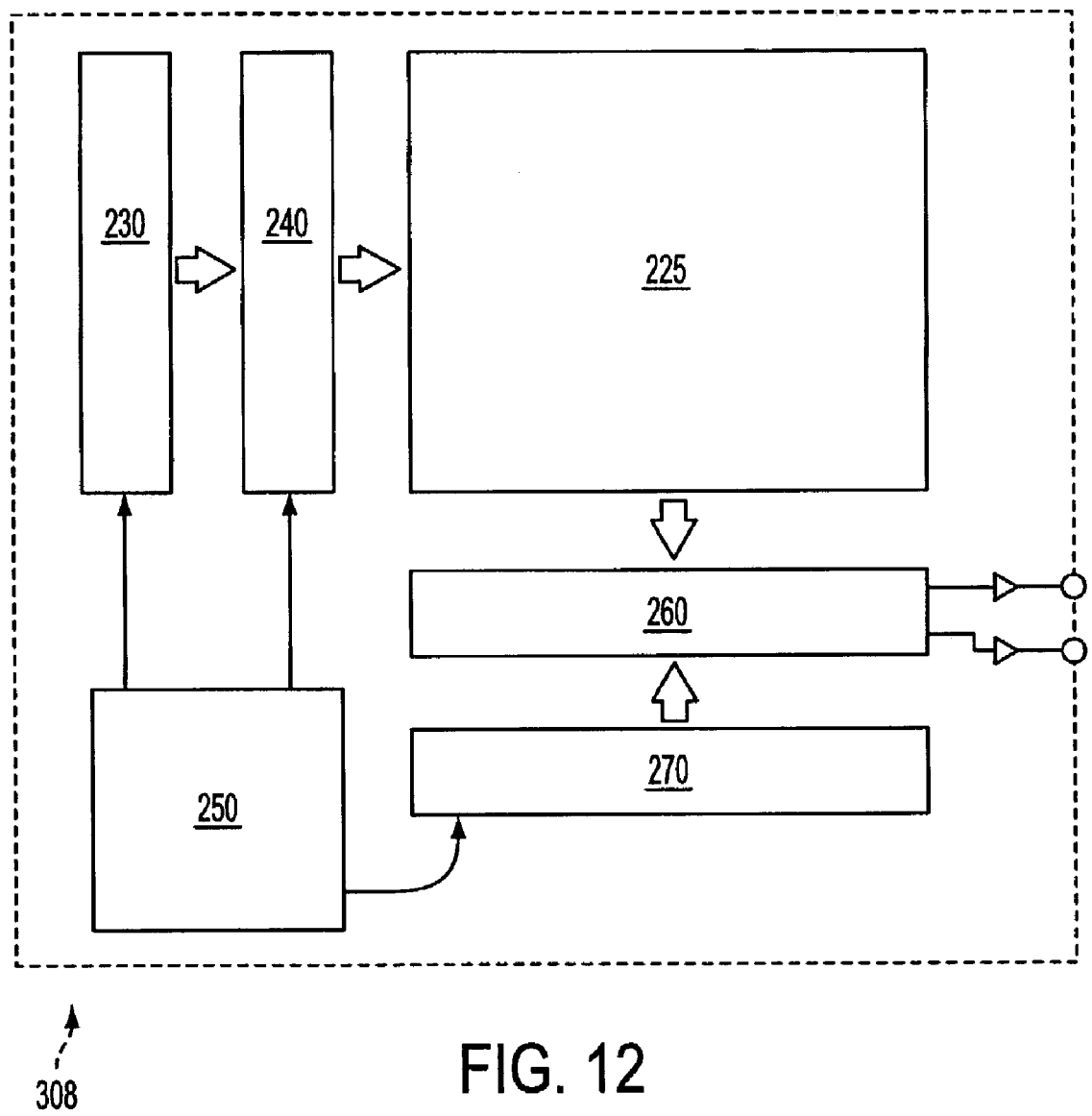
FIG. 12 is an exemplary imager constructed in accordance with an embodiment of the invention.

FIG. 12 illustrates a block diagram for a CMOS imager device 308 having a pixel array 225 incorporating pixels 10, 110 constructed in the manner discussed above in relation to FIGS. 1–10. Pixel array 225 comprises a plurality of pixels arranged in a predetermined number of columns and rows. The pixels of each row in array 225 can all be turned on at the same time by a row select line and the pixels of each column are selectively output by a column select line. A plurality of rows and column lines are provided for the entire array 225. The row lines are selectively activated by the row driver 240 in response to row address decoder 230 and the column select lines are selectively activated by the column driver 260 in response to column address decoder 270. Thus, a row and column address is provided for each pixel in the array 225.

The CMOS imager device 308 is operated by the control circuit 250, which controls address decoders 230, 270 for selecting the appropriate row and column lines for pixel readout, and row and column driver circuitry 240, 260, which apply driving voltages to the drive transistors of the selected row and column lines. Typically, the signal flow in the imager device 308 would begin at the array 225 upon its receiving photo-input and generating a charge. The signal is output to a read-out circuit and then to an analog-to-digital conversion device. Then the signal is transferred to an image processor, a serializer and then the is output from the imager device.

Figure 13:
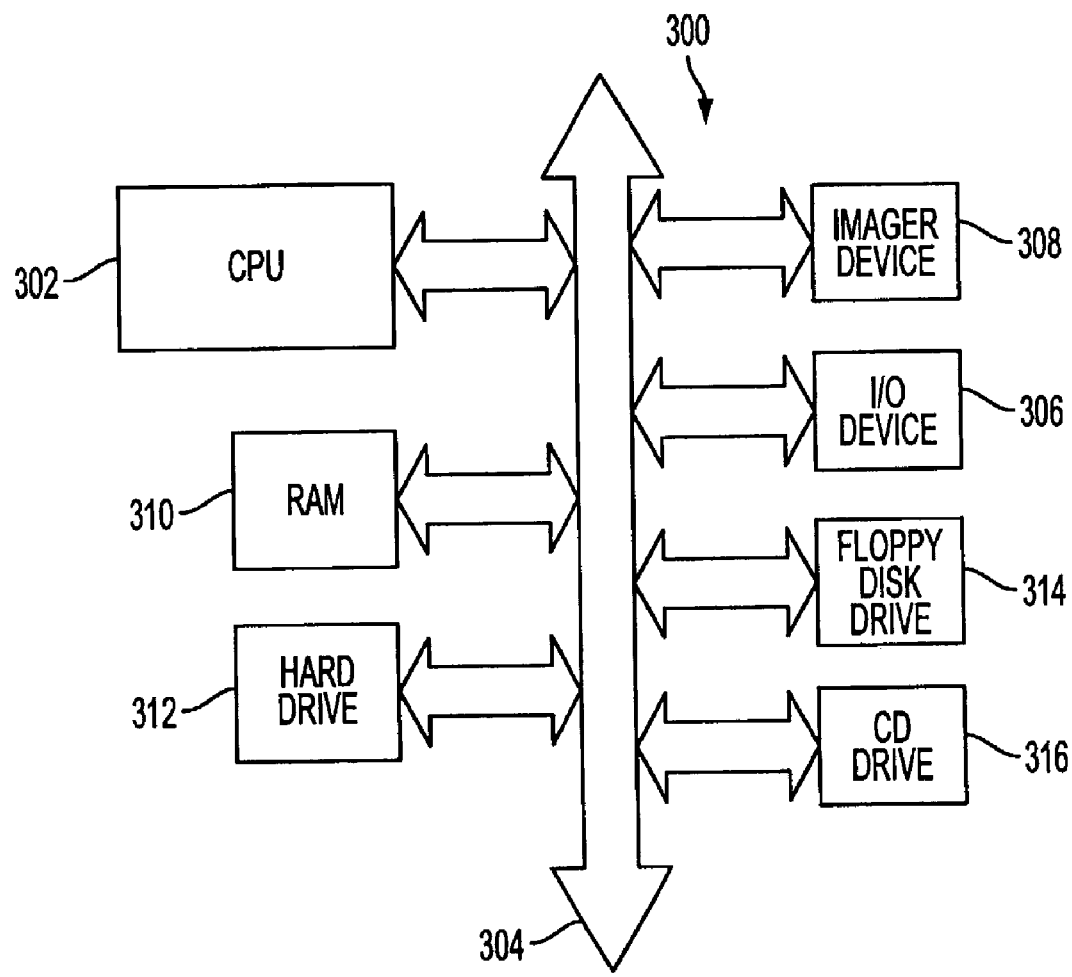
FIG. 13 shows a processor system incorporating at least one imager device constructed in accordance with an embodiment of the invention.

FIG. 13 shows system 300, a typical processor based system modified to include an imager device 308 as in FIG. 12 and an input device to the system 300. The imager device 308 may also receive control or other data from system 300 as well. Examples of processor based systems, which may employ the imager device 308, include, without limitation, computer systems, camera systems, scanners, machine vision systems, vehicle navigation systems, video telephones, surveillance systems, auto focus systems, star tracker systems, motion detection systems, image stabilization systems, and others.

System 300 includes a central processing unit (CPU) 302 that communicates with various devices over a bus 304. Some of the devices connected to the bus 304 provide communication into and out of the system 300, illustratively including an input/output (I/O) device 306 and imager device 308. Other devices connected to the bus 304 provide memory, illustratively including a random access memory (RAM) 310, hard drive 312, and one or more peripheral memory devices such as a floppy disk drive 314 and compact disk (CD) drive 316. The imager device 308 may be combined with a processor, such as a CPU, digital signal processor, or microprocessor, in a single integrated circuit. The imager device 308 may be a CCD imager or CMOS imager constructed in accordance with any of the illustrated embodiments.

Thus, the present invention provides imagers with (1) high conversion gain and sensitivity to achieve excellent low light performance and (2) high full well capacity and conversion gain to achieve high dynamic range—something that is not achievable with current image technology.

It should be appreciated that the dual conversion gain principles of the invention could be incorporated into many different imager devices (CCD or CMOS) and imager configurations (e.g., two transistor (2T), 3T, 4T, etc.). The principles of the invention may be utilized with any capacitor-transistor series structure. It should also be appreciated that the invention is not limited solely to dual conversion gain principles. That is, a floating diffusion node could be connected to multiple dual conversion gain transistors and associated capacitors to provide the floating diffusion node with more than two conversion gains if desired. And while the invention has been described with reference to one exemplary timing diagram (FIG. 3) it is possible to use other timings. For example, there can be applications where one allows the capacitor 32 to be chosen so that there is charge sharing during SHS2 sampling. After SHS2 is sampled, the transfer gate, dual conversion gain and reset transistors are simultaneously turned on and all nodes are reset. This eliminates the shared charge and prevents lag issues in the next readout frame. This is an example of alternative timing that has benefits in association with the novel dual conversion gain concept.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. An imager device, comprising:
   a floating diffusion region, connected to receive stored charge from a photosensitive device; and
   a circuit connected to said floating diffusion region, said circuit providing said floating diffusion region with at least a dual conversion gain switchable between first and second conversion gains, said circuit comprising a capacitive element and a dual conversion gain switching element, said dual conversion gain switching element being controlled to disconnect said capacitive element from said floating diffusion region such that said floating diffusion region has the first conversion gain during a first lighting condition and connect said capacitive element to said floating diffusion region such that said floating diffusion region obtains the second conversion gain during a second lighting condition.

2. The imager device of claim 1 wherein said circuit is controlled to change the first conversion gain to the second conversion gain and to change the second conversion gain to the first conversion gain.

3. The imager device of claim 2, wherein said floating diffusion region has a first capacitance associated with the first conversion gain, said capacitive element has a second capacitance, and a combination of the first and second capacitances is associated with the second conversion gain.

4. The imager device of claim 3, wherein the photosensitive device has a capacitance greater than the first capacitance and less than the combination of the first and second capacitances.

5. The imager device of claim 3, wherein said dual conversion gain switching element is a transistor having a gate connected to receive a dual conversion gain control signal.

6. The imager device of claim 3, wherein said dual conversion gain switching element is a transistor and said capacitive element is a capacitor, said transistor is connected between said floating diffusion region and a first terminal of said capacitor, and a second terminal of said capacitor is connected to a supply voltage.

7. The imager device of claim 3, wherein said dual conversion gain switching element is a transistor and said capacitive element is a capacitor, said transistor is connected between said floating diffusion region and a first terminal of said capacitor, and a second terminal of said capacitor is connected to a ground potential.

8. The imager device of claim 3, wherein said dual conversion gain switching element is a transistor and said capacitive element is a capacitor, said capacitor is connected between said floating diffusion region and a first source/drain terminal of said transistor, and a second source/drain terminal of said transistor is connected to a supply voltage.

9. The imager device of claim 3, wherein said dual conversion gain switching element is a transistor and said capacitive element is a capacitor, said capacitor is connected between said floating diffusion region and a first source/drain terminal of said transistor, and a second source/drain terminal of said transistor is connected to a ground potential.

10. The imager device of claim 1, wherein said circuit is controlled based on an amount of stored charge detected in said device.

11. The imager device of claim 1, wherein said imager device is a complementary metal oxide semiconductor imager.

12. The imager device of claim 1, wherein said imager device is a charge coupled device imager.

13. The imager device of claim 1, wherein said circuit is connected to a supply voltage of an imager pixel array.

14. The imager device of claim 1, wherein said circuit is connected to a ground potential.

15. The imager device of claim 1, wherein said circuit provides said floating diffusion region with more than two conversion gains.

16. The imager device of claim 1, further comprising sample and hold circuitry for sampling and holding a reference output and multiple pixel signal outputs from said floating diffusion region.

17. A CMOS imager pixel, comprising:
   a photosensor for accumulating stored charge;
   a diffusion region, connected to receive the charge from the photosensor, said diffusion region having a first conversion gain; and
   a conversion gain altering circuit connected to said diffusion region, said conversion gain altering circuit being controlled to change the first conversion gain to the second conversion gain and to change the second conversion gain to the first conversion gain, said conversion gain altering circuit comprising a capacitive element and a dual conversion gain switching element, said dual conversion gain switching element being controlled to disconnect said capacitive element from said diffusion region such that said diffusion region has the first conversion gain during a first lighting condition and connect said capacitive element to said diffusion region such that said diffusion region obtains the second conversion gain during a second lighting condition.

18. The CMOS imager pixel of claim 17, wherein said photosensor has a first capacitance and said diffusion region has a second capacitance that is less than the first capacitance.

19. The CMOS imager pixel of claim 17, wherein said photosensor is a photodiode.

20. The CMOS imager pixel of claim 17, wherein said photosensor is a photodiode connected to a capacitor.

21. The CMOS imager pixel of claim 17, wherein said photosensor is a photogate.

22. The CMOS imager pixel of claim 17, wherein said photosensor is a photoconductor.

23. The CMOS imager pixel of claim 17, wherein said diffusion region has a first capacitance associated with the first conversion gain, said capacitive element has a second capacitance, and a combination of the first and second capacitances is associated with the second conversion gain.

24. The CMOS imager pixel of claim 17, wherein said photosensor has a capacitance greater than the first capacitance and less than the combination of the first and second capacitances.

25. The CMOS imager pixel of claim 17, wherein said dual conversion gain switching element is a transistor having a gate connected to receive a dual conversion gain control signal.

26. The CMOS imager pixel of claim 17, wherein said dual conversion gain switching element is a transistor and said capacitive element is a capacitor, said transistor is connected between said floating diffusion region and a first terminal of said capacitor, and a second terminal of said capacitor is connected to a supply voltage.

27. The CMOS imager pixel of claim 17, wherein said dual conversion gain switching element is a transistor and said capacitive element is a capacitor, said transistor is connected between said floating diffusion region and a first terminal of said capacitor, and a second terminal of said capacitor is connected to a ground potential.

28. The CMOS imager pixel of claim 17, wherein said dual conversion gain switching element is a transistor and said capacitive element is a capacitor, said capacitor is connected between said floating diffusion region and a first source/drain terminal of said transistor, and a second source/drain terminal of said transistor is connected to a supply voltage.

29. The CMOS imager pixel of claim 17, wherein said dual conversion gain switching element is a transistor and said capacitive element is a capacitor, said capacitor is connected between said floating diffusion region and a first source/drain terminal of said transistor, and a second source/drain terminal of said transistor is connected to a ground potential.

30. The CMOS imager pixel of claim 17, wherein the first conversion gain is used during low light conditions and the second conversion gain is used during bright light conditions.

31. The CMOS imager pixel of claim 17, wherein said conversion gain altering circuit is connected to a supply voltage of an imager pixel array.

32. The CMOS imager pixel of claim 17, wherein said conversion gain altering circuit is connected to a ground potential.

33. The CMOS imager pixel of claim 17, further comprising sample and hold circuitry for sampling and holding a reference output and multiple pixel signal outputs from said diffusion region.

34. A CMOS imager pixel, comprising:
a photosensor for accumulating stored charge;
a first transistor being controlled to reset said pixel;
a second transistor being controlled to transfer the stored charge from the photosensor;
a floating diffusion region connected to receive the charge from said photosensor through said second transistor, said floating diffusion region having a first conversion gain;
a capacitive element; and
a third transistor coupled between said floating diffusion region and said capacitive element, said third transistor being controlled to connect said capacitive element to said floating diffusion region during a first lighting condition such that said floating diffusion region obtains at least a second conversion gain, said third transistor being controlled to disconnect said capacitive element from said floating diffusion region during a second lighting condition.

35. The CMOS imager pixel of claim 34, wherein said capacitive element is further coupled to a supply voltage.

36. The CMOS imager pixel of claim 34, wherein said capacitive element is further coupled to a ground potential.

37. The CMOS imager pixel of claim 34, further comprising:
a second capacitive element; and
a fourth transistor coupled between said floating diffusion region and said second capacitive element, said fourth transistor being controlled to connect said second capacitive element to said floating diffusion region such that said floating diffusion region obtains at least a third conversion gain.

38. A CMOS imager pixel, comprising:
a photosensor for accumulating stored charge;
a first transistor being controlled to reset said pixel;
a second transistor being controlled to transfer the stored charge from the photosensor;
a floating diffusion region connected to receive the charge from said photosensor through second transistor, said floating diffusion region having a first conversion gain;
a third transistor; and
a capacitive element coupled between said diffusion region and said third transistor, said third transistor being controlled to connect said capacitive element to said floating diffusion region during a first lighting condition such that said floating diffusion region obtains at least a second conversion gain, said third transistor being controlled to disconnect said capacitive element from said floating diffusion region during a second lighting condition.

39. The CMOS imager pixel of claim 38, wherein said third transistor is further coupled to a supply voltage.

40. The CMOS imager pixel of claim 38, wherein said third transistor is further coupled to a ground potential.

41. The CMOS imager pixel of claim 38, further comprising:
a fourth transistor; and
a second capacitive element coupled between said floating diffusion region and said fourth transistor, said fourth transistor being controlled to connect said second capacitive element to said floating diffusion region such that said floating diffusion region obtains at least a third conversion gain.

42. A CMOS imager pixel, comprising:
a photosensor for accumulating stored charge, said photosensor having a first charge storing capacity;
a first transistor being controlled to reset said pixel;
a diffusion region connected to receive the charge from said photosensor, said diffusion region having a second charge storing capacity different from the first charge storing capacity, said diffusion region having a first conversion gain based on the second charge storing capacity;
a capacitive element; and
a second transistor coupled between said diffusion region and said capacitive element, said second transistor being controlled to connect said capacitive element to said diffusion region such that said diffusion region obtains a third charge storing capacity and a second conversion gain based on the third charge storing capacity.

43. The CMOS imager pixel of claim 42, wherein said capacitive element is further coupled to a supply voltage.

44. The CMOS imager pixel of claim 42, wherein said capacitive element is further coupled to a ground potential.

45. The CMOS imager pixel of claim 42 further comprising:
a second capacitive element; and
a third transistor coupled between said diffusion region and said second capacitive element, said third transistor being controlled to connect said second capacitive element to said diffusion region such that said diffusion region obtains at least a third conversion gain.

46. A CMOS imager pixel, comprising:
a photosensor for accumulating stored charge, said photosensor having a first charge storing capacity;

a first transistor being controlled to reset said pixel;
a diffusion region connected to receive the charge from said photosensor, said diffusion region having a second charge storing capacity different from the first charge storing capacity, said diffusion region having a first conversion gain based on the second charge storing capacity;
a second transistor; and
a capacitive element coupled between said diffusion region and said second transistor, said second transistor being controlled to connect said capacitive element to said diffusion region such that said diffusion region obtains a third charge storing capacity and a second conversion gain based on the third charge storing capacity.

47. The CMOS imager pixel of claim 46, wherein said second transistor is further coupled to a supply voltage.

48. The CMOS imager pixel of claim 46, wherein said second transistor is further coupled to a ground potential.

49. The CMOS imager pixel of claim 46 further comprising:
a third transistor; and
a second capacitive element coupled between said diffusion region and said third transistor, said third transistor being controlled to connect said second capacitive element to said diffusion region such that said diffusion region obtains at least a third conversion gain.

50. A CCD imager comprising:
a register for inputting and outputting photo-generated charge;
a diffusion region, connected to receive the photo-generated charge from said register, said diffusion region having a first conversion gain; and
a conversion gain altering circuit connected to said diffusion region, said conversion gain altering circuit being controlled to change the first conversion gain to the second conversion gain and to change the second conversion gain to the first conversion gain, said conversion gain altering circuit comprising a capacitive element and a dual conversion gain switching element, said dual conversion gain switching element being controlled to disconnect said capacitive element from said diffusion region such that said diffusion region has the first conversion gain during a first lighting condition and connect said capacitive element to said diffusion region such that said diffusion region obtains the second conversion gain during a second lighting condition.

51. The imager of claim 50, wherein the first conversion gain is used during low light conditions and the second conversion gain is used during bright light conditions.

52. The imager of claim 50, wherein said diffusion region has a first capacitance associated with the first conversion gain, said capacitive element has a second capacitance, and a combination of the first and second capacitances is associated with the second conversion gain.

53. The imager of claim 52, wherein a register charge storing capacitance is greater than the first capacitance and less than the combination of the first and second capacitances.

54. The imager of claim 50, wherein said dual conversion gain switching element is a transistor having a gate connected to receive a dual conversion gain control signal.

55. The imager of claim 50, wherein said conversion gain altering circuit is controlled based on an amount of stored charge detected in said device.

56. The imager of claim 50, wherein said dual conversion gain switching element is a transistor and said capacitive element is a capacitor, said transistor is connected between said floating diffusion region and a first terminal of said capacitor, and a second terminal of said capacitor is connected to a supply voltage.

57. The imager of claim 50, wherein said dual conversion gain switching element is a transistor and said capacitive element is a capacitor, said transistor is connected between said floating diffusion region and a first terminal of said capacitor, and a second terminal of said capacitor is connected to a ground potential.

58. The imager of claim 50, wherein said dual conversion gain switching element is a transistor and said capacitive element is a capacitor, said capacitor is connected between said floating diffusion region and a first source/drain terminal of said transistor, and a second source/drain terminal of said transistor is connected to a supply voltage.

59. The imager of claim 50, wherein said dual conversion gain switching element is a transistor and said capacitive element is a capacitor, said capacitor is connected between said floating diffusion region and a first source/drain terminal of said transistor, and a second source/drain terminal of said transistor is connected to a ground potential.

60. The imager of claim 50, wherein said circuit is connected to a supply voltage.

61. The imager of claim 50, wherein said circuit is connected to a ground potential.

62. The imager of claim 50, wherein said circuit provides said diffusion region with more than two conversion gains.

63. An imager system, comprising:
a processor; and
an imaging device electrically coupled to said processor, said imaging device comprising a pixel array, at least one pixel of said array comprising:
a photosensor for accumulating stored charge,
a diffusion region, connected to receive the charge from the photosensor, said diffusion region having a first conversion gain, and
a conversion gain altering circuit connected to said diffusion region, said conversion gain altering circuit being controlled to change the first conversion gain to the second conversion gain and to change the second conversion gain to the first conversion gain, said conversion gain altering circuit comprising a capacitive element and a dual conversion gain switching element, said dual conversion gain switching element being controlled to disconnect said capacitive element from said diffusion region such that said diffusion region has the first conversion gain during a first lighting condition and connect said capacitive element to said diffusion region such that said diffusion region obtains the second conversion gain during a second lighting condition.

64. The system of claim 63, wherein said photosensor has a first capacitance and said diffusion region has a second capacitance that is less than the first capacitance.

65. The system of claim 63, wherein said photosensor is a photodiode.

66. The system of claim 63, wherein said photosensor is a photodiode connected to a capacitor.

67. The system of claim 63, wherein said photosensor is a photogate.

68. The system of claim 63, wherein said photosensor is a photoconductor.

69. The system of claim 63, wherein said array is a CMOS array.

70. The system of claim 63, wherein said array is a CCD array.

71. The system of claim 63, wherein said diffusion region has a first capacitance associated with the first conversion gain, said capacitive element has a second capacitance, and a combination of the first and second capacitances is associated with the second conversion gain.

72. The system of claim 71, wherein said photosensor has a capacitance greater than the first capacitance and less than the combination of the first and second capacitances.

73. The system of claim 63, wherein said capacitive element is a capacitor.

74. The system of claim 63, wherein said capacitive element is a polysilicon capacitor.

75. The system of claim 63, wherein said dual conversion gain switching element is a transistor having a gate connected to receive a dual conversion gain control signal.

76. The system of claim 63, wherein said dual conversion gain switching element is a transistor and said capacitive element is a capacitor, said transistor is connected between said floating diffusion region and a first terminal of said capacitor, and a second terminal of said capacitor is connected to a supply voltage.

77. The system of claim 63, wherein said dual conversion gain switching element is a transistor and said capacitive element is a capacitor, said transistor is connected between said floating diffusion region and a first terminal of said capacitor, and a second terminal of said capacitor is connected to a ground potential.

78. The system of claim 63, wherein said dual conversion gain switching element is a transistor and said capacitive element is a capacitor, said capacitor is connected between said floating diffusion region and a first source/drain terminal of said transistor, and a second source/drain terminal of said transistor is connected to a supply voltage.

79. The system of claim 63, wherein said dual conversion gain switching element is a transistor and said capacitive element is a capacitor, said capacitor is connected between said floating diffusion region and a first source/drain terminal of said transistor, and a second source/drain terminal of said transistor is connected to a ground potential.

80. The system of claim 63, wherein said circuit is connected to a supply voltage.

81. The system of claim 63, wherein said circuit is connected to a ground potential.

82. The system of claim 63, wherein said circuit provides said diffusion region with more than two conversion gains.

83. The system of claim 63, wherein the first conversion gain is used during low light conditions and the second conversion gain is used during bright light conditions.

84. The system of claim 63, further comprising sample and hold circuitry for sampling and holding a reference output and multiple pixel signal outputs from said diffusion region.

85. An imager system, comprising:
a processor; and
an imaging device electrically coupled to said processor, said imaging device comprising:
a floating diffusion region, connected to receive stored charge from a photosensitive device; and
a circuit connected to said diffusion region, said circuit providing said diffusion region with multiple conversion gains by switching in a first capacitive element during a first lighting condition to achieve a first conversion gain, switching in a second capacitive element during a second lighting condition to achieve a second conversion gain, said first and second conversion gains being different than a conversion gain of the diffusion region.

86. An imager system, comprising:
a processor; and
an imaging device electrically coupled to said processor, said imaging device comprising:
a register for inputting and outputting photo-generated charge;
a diffusion region, connected to receive the photo-generated charge from said register, said diffusion region having a first conversion gain, and
a conversion gain altering circuit connected to said diffusion region, said conversion gain altering circuit being controlled to change the first conversion gain to one of multiple conversion gains by switching in and connecting a corresponding capacitance to the diffusion region and to change said one of multiple conversion gains to said first conversion gain by disconnecting said corresponding capacitance from said diffusion region.

87. A method of operating an imager device, said method comprising:
storing photo-generated charge in a diffusion region having a charge storing capacity that is less than a charge storing capacity of a photosensitive device generating the photo-generated charge;
outputting a first signal representing the stored photo-generated charge;
changing a conversion gain of the diffusion region by changing the charge storing capacity of the region; and
outputting a second signal representing the stored photo-generated charge in the diffusion region having the changed conversion gain.

88. The method of claim 87, wherein said changing step comprises:
changing a capacitance of the diffusion region.

89. The method of claim 87, wherein said changing step comprises:
increasing a capacitance of the diffusion region.

90. The method of claim 87 further comprising:
resetting the diffusion region to an array supply voltage prior to storing the photo-generated charge; and
outputting a third signal representing the reset diffusion region.

91. The method of claim 90 further comprising the acts of:
sampling and holding the first, second and third signals; and
using the sampled and held first, second and third signals to obtain a correlated output value.

92. The method of claim 87 further comprising:
simultaneously resetting the diffusion region and a photosensor providing the photo-generated charge prior to storing the photo-generated charge in the diffusion region; and
outputting a third signal representing the reset diffusion region.

93. The method of claim 92 further comprising the acts of:
sampling and holding the first, second and third signals; and
using the sampled and held first, second and third signals to obtain a correlated output value.

94. The method of claim 87 further comprising:
simultaneously resetting the diffusion region, a photosensor providing the photo-generated charge and a capacitive region used to change the conversion gain.

95. The method of claim 94, wherein said resetting step substantially eliminates shared charges.

96. The method of claim 94, wherein said resetting step substantially eliminates lag for a subsequent readout operation.

97. A method of operating an imager device, said method comprising:
  transferring photo-generated charge to a diffusion region having a charge storing capacity that is less than a charge storing capacity of a photosensitive device generating the photo-generated charge;
  determining an amount of the stored charge;
  comparing the amount to a predetermined threshold;
  changing a conversion gain of the diffusion region by changing the charge storing capacity of the region if it is determined that the amount of stored charge exceeds the threshold; and
  outputting a signal indicative of the charge in the diffusion region.

98. The method of claim 97, wherein said changing step comprises:
  changing a capacitance of the diffusion region.

99. The method of claim 97, wherein said changing step comprises:
  increasing a capacitance of the diffusion region.

100. The method of claim 96 further comprising:
  resetting the diffusion region to an array supply voltage prior to storing the photo-generated charge; and
  outputting a third signal representing the reset diffusion region.

101. The method of claim 100 further comprising the acts of:
  sampling and holding the first, second and third signals; and
  using the sampled and held first, second and third signals to obtain a correlated output value.

102. The method of claim 97 further comprising:
  simultaneously resetting the diffusion region and a photosensor providing the photo-generated charge prior to storing the photo-generated charge in the diffusion region; and
  outputting a third signal representing the reset diffusion region.

103. The method of claim 102 further comprising the acts of:
  sampling and holding the first, second and third signals; and
  using the sampled and held first, second and third signals to obtain a correlated output value.

104. The method of claim 97 further comprising:
  simultaneously resetting the diffusion region, a photosensor providing the photo-generated charge and a capacitive region used to change the conversion gain.

105. The method of claim 104, wherein said resetting step substantially eliminates shared charges.

106. The method of claim 104, wherein said resetting step substantially eliminates lag for a subsequent readout operation.

107. A method of operating a CMOS imager device, said method comprising:
  providing a photosensor having a first capacitance;
  providing a diffusion region having a second capacitance that is less than the first capacitance;
  storing photo-generated charge from the photosensor in the diffusion region;
  determining an amount of the stored charge;
  comparing the amount to a predetermined threshold; and
  adding a third capacitance to the diffusion region such that the combination of the second and third capacitances is greater than the first capacitance if it is determined that the amount of stored charge exceeds the threshold.

108. The method of claim 107, wherein said adding step changes a conversion gain of the diffusion region.

109. The method of claim 107 further comprising:
  resetting the diffusion region to an array supply voltage prior to storing the photo-generated charge; and
  outputting a third signal representing the reset diffusion region.

110. The method of claim 109 further comprising the acts of:
  sampling and holding the first, second and third signals; and
  using the sampled and held first, second and third signals to obtain a correlated output value.

111. The method of claim 107 further comprising:
  simultaneously resetting the diffusion region and the photosensor prior to storing the photo-generated charge in the diffusion region; and
  outputting a third signal representing the reset diffusion region.

112. The method of claim 111 further comprising the acts of:
  sampling and holding the first, second and third signals; and
  using the sampled and held first, second and third signals to obtain a correlated output value.

113. The method of claim 107 further comprising:
  simultaneously resetting the diffusion region, the photosensor and a capacitive region used to change the conversion gain.

114. The method of claim 113, wherein said resetting step substantially eliminates shared charges.

115. The method of claim 113, wherein said resetting step substantially eliminates lag for a subsequent readout operation.

116. A method of fabricating a dual conversion gain pixel, said method comprising the steps of:
  providing a substrate;
  providing a photosensitive region within the substrate;
  providing a floating diffusion region within said substrate, the floating diffusion region having a first capacitance; and
  providing a conversion gain altering circuit within the substrate, wherein the conversion gain altering circuit is controllable to add a second capacitance to the capacitance of the diffusion region, said act of providing the gain altering circuit comprises forming a capacitive element within the substrate and forming a transistor within the substrate, wherein the transistor is connected between the diffusion region and the capacitive element such that when the transistor is activated, a capacitance of the capacitive element is added to the first capacitance.

117. The method of claim 116 wherein said step of providing a photosensitive region within the substrate comprises providing a photodiode with a high pinning voltage within the substrate.

118. The method of claim 116 wherein said step of providing a photosensitive region within the substrate comprises:
  providing a photodiode within the substrate; and
  connecting the photodiode to a capacitor.

119. The method of claim 116 wherein said step of providing a photosensitive region within the substrate comprises providing a photogate within the substrate.

120. A method of fabricating a dual conversion gain pixel, said method comprising the steps of:
- providing a substrate;
- providing a photosensitive region within the substrate;
- forming a first transistor within the substrate for resetting the pixel;
- providing a floating diffusion region within said substrate, the floating diffusion region having a first capacitance;
- providing a second transistor between the photosensitive region and the floating diffusion region, the second transistor being controllable to transfer charge from the photosensitive region to the floating diffusion region;
- forming a capacitive element within the substrate; and
- forming a third transistor within the substrate, wherein the third transistor is connected between the diffusion region and the capacitive element such that when the third transistor is activated, a capacitance of the capacitive element is added to the first capacitance.

121. A method of fabricating a dual conversion gain pixel, said method comprising the steps of:
- providing a substrate;
- providing a photosensitive region within the substrate;
- forming a first transistor within the substrate for resetting the pixel;
- providing a floating diffusion region within said substrate, the floating diffusion region having a first capacitance and being connected to the photosensitive region;
- forming a capacitive element within the substrate; and
- forming a second transistor within the substrate, wherein the second transistor is connected between the diffusion region and the capacitive element such that when the second transistor is activated, a capacitance of the capacitive element is added to the first capacitance.

* * * * *

UNITED STATES PATENT AND TRADEMARK OFFICE
CERTIFICATE OF CORRECTION

PATENT NO. : 7,075,049 B2
APPLICATION NO. : 10/458262
DATED : July 11, 2006
INVENTOR(S) : Howard E. Rhodes et al.

It is certified that error appears in the above-identified patent and that said Letters Patent is hereby corrected as shown below:

In the Specification, the following omissions are corrected:

Column 2, line 29, "is graph" should read --is a graph--;

Column 8, line 62, "of stored" should read --of charge stored--; and

Column 10, line 9, "the is" should read --the image is--.

In the Claims, the following error is corrected:

Claim 100, column 19, line 21, "claim 96" should read --claim 97--.

Signed and Sealed this

Third Day of April, 2007

JON W. DUDAS
*Director of the United States Patent and Trademark Office*